US010228747B2

(12) United States Patent
Chandra et al.

(10) Patent No.: US 10,228,747 B2
(45) **Date of Patent: *Mar. 12, 2019**

(54) BATTERY PARAMETER-BASED POWER MANAGEMENT FOR SUPPRESSING POWER SPIKES

(71) Applicant: Microsoft Technology Licensing, LLC, Redmond, WA (US)

(72) Inventors: Ranveer Chandra, Kirkland, WA (US); Stephen E. Hodges, Cambridge (GB); Julia L. Meinershagen, Seattle, WA (US); Nissanka Arachchige Bodhi Priyantha, Redmond, WA (US); Anirudh Badam, Issaquah, WA (US); Thomas Moscibroda, Beijing (CN); Pan Hu, Amherst, MA (US); Anthony John Ferrese, Berkeley, CA (US); Evangelia Skiani, New York, NY (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/613,372

(22) Filed: Jun. 5, 2017

(65) Prior Publication Data

US 2017/0269670 A1 Sep. 21, 2017

Related U.S. Application Data

(63) Continuation of application No. 14/617,719, filed on Feb. 9, 2015, now Pat. No. 9,696,782.

(51) Int. Cl.
*G06F 1/26* (2006.01)
*G06F 1/32* (2006.01)
(Continued)

(52) U.S. Cl.
CPC .......... *G06F 1/3212* (2013.01); *G06F 1/3206* (2013.01); *G06F 1/329* (2013.01);
(Continued)

(58) Field of Classification Search
CPC . G01R 31/3693; G06F 1/3212; G06F 1/3287; G06F 1/329; G06F 1/3206; Y02D 10/171; Y02D 10/174; Y02D 10/24
(Continued)

(56) References Cited

U.S. PATENT DOCUMENTS 4,145,669 A 3/1979 Babcock et al.
5,091,819 A 2/1992 Christensen et al.
(Continued)

FOREIGN PATENT DOCUMENTS

CN 101714629 5/2010
CN 101834320 9/2010
(Continued)

OTHER PUBLICATIONS

"Final Office Action", U.S. Appl. No. 14/626,600, dated Nov. 16, 2017, 31 pages.
(Continued)

*Primary Examiner* — Chun Cao
(74) *Attorney, Agent, or Firm* — Schwegman Lundberg & Woessner, P.A.

(57) ABSTRACT

This document describes techniques and apparatuses for suppressing power spikes. In some embodiments, these techniques and apparatuses determine an available amount of power that a battery is capable of providing while maintaining a particular voltage level and a requisite amount of power that components will consume to perform a task. When the requisite amount of power exceeds the available
(Continued)

amount of power, execution of the task or other tasks can be rescheduled effective to enable the battery to maintain the particular voltage level.

18 Claims, 10 Drawing Sheets

(51) Int. Cl.
*G06F 1/3212* (2019.01)
*G06F 1/329* (2019.01)
*G06F 1/3287* (2019.01)
*G06F 1/3206* (2019.01)
*G01R 31/36* (2019.01)

(52) U.S. Cl.
CPC ........ *G06F 1/3287* (2013.01); *G01R 31/3693* (2013.01); *Y02D 10/171* (2018.01); *Y02D 10/174* (2018.01); *Y02D 10/24* (2018.01)

(58) Field of Classification Search
USPC .................................... 713/300, 340; 714/14
See application file for complete search history.

(56) References Cited

U.S. PATENT DOCUMENTS 5,315,228 A 5/1994 Hess et al.
5,519,261 A 5/1996 Stewart
5,543,245 A 8/1996 Andrieu et al.
5,614,332 A 3/1997 Pavelle et al.
5,684,404 A 11/1997 Millar
5,691,742 A 11/1997 O'Connor et al.
5,693,010 A 12/1997 Ledger et al.
5,705,929 A 1/1998 Caravello et al.
5,764,032 A 6/1998 Moore
5,818,200 A 10/1998 Cummings et al.
5,894,212 A 4/1999 Balogh
5,914,585 A 6/1999 Grabon
5,963,010 A 10/1999 Hayashi et al.
6,139,987 A 10/2000 Koo et al.
6,154,012 A 11/2000 Drori
6,252,511 B1 6/2001 Mondshine et al.
6,258,473 B1 7/2001 Spillman et al.
6,268,711 B1 7/2001 Bearfield
6,299,998 B1 10/2001 Morris et al.
6,346,794 B1 2/2002 Odaohhara
6,353,304 B1 3/2002 Atcitty et al.
6,417,646 B1 7/2002 Huykman et al.
6,463,495 B1 10/2002 Angelo et al.
6,650,089 B1 11/2003 Freeman et al.
6,710,578 B1 3/2004 Sklovsky
6,771,044 B1 8/2004 Vinciguerra et al.
6,833,792 B1 12/2004 Smith et al.
6,847,191 B1 1/2005 Wang
6,920,404 B2 7/2005 Yamanaka
RE38,918 E 12/2005 Svensson et al.
6,977,479 B2 12/2005 Hsu
6,992,580 B2 1/2006 Kotzin et al.
7,015,596 B2 3/2006 Pail
7,020,500 B2 3/2006 Saghbini
7,059,769 B1 6/2006 Potega
7,193,334 B2 3/2007 Hiramitsu et al.
7,333,998 B2 2/2008 Heckerman et al.
7,339,348 B2 3/2008 Bui et al.
7,339,353 B1 3/2008 Masias et al.
7,383,451 B2 6/2008 Matsushima et al.
7,415,623 B2 8/2008 Rapps et al.
7,430,675 B2 9/2008 Lee
7,430,679 B2 9/2008 Tevanian, Jr.
7,475,267 B1 1/2009 Cocosel
7,531,989 B2 5/2009 Maireanu
7,574,661 B2 8/2009 Matsuura et al.
7,583,951 B2 9/2009 Gibbs
7,684,942 B2 3/2010 Yun et al.
7,716,500 B2 5/2010 Esliger
7,734,317 B2 6/2010 Patel et al.
7,787,405 B2 8/2010 Dettinger et al.
7,814,348 B2 10/2010 Krajcovic et al.
7,839,121 B2 11/2010 Kim
7,944,662 B2 5/2011 Carkner et al.
8,001,400 B2 8/2011 Fadell
8,001,407 B2 8/2011 Malone et al.
8,032,317 B2 10/2011 Houston et al.
8,063,606 B2 11/2011 Veselic
8,097,355 B2 1/2012 Larsen
8,138,726 B2 3/2012 Partin et al.
8,255,716 B2 8/2012 Mandyam
8,258,748 B2 9/2012 Constien et al.
8,313,864 B2 11/2012 Christensen et al.
8,330,419 B2 12/2012 Kim et al.
8,369,904 B2 2/2013 Bennis et al.
8,386,816 B2 2/2013 Elsilä et al.
8,386,826 B2 2/2013 Newman
8,405,332 B1 3/2013 Krishnamoorthy et al.
8,423,306 B2 4/2013 Duncan
8,427,106 B2 4/2013 Kim et al.
8,456,136 B2 6/2013 Kim et al.
8,471,521 B2 6/2013 Stewart et al.
8,482,254 B2 7/2013 Ho
8,487,473 B2 7/2013 Peterson et al.
8,508,191 B2 8/2013 Kim et al.
8,538,686 B2 9/2013 Gruen et al.
8,594,648 B2 11/2013 Musial et al.
8,598,838 B2 12/2013 Cunico
8,598,849 B2 12/2013 Bhardwaj et al.
8,607,036 B2 12/2013 More et al.
8,624,560 B2 1/2014 Ungar et al.
8,629,652 B2 1/2014 Partovi et al.
8,648,493 B2 2/2014 Park
8,648,567 B2 2/2014 Hoffman
8,665,214 B2 3/2014 Forutanpour et al.
8,686,693 B2 4/2014 Bhowmik et al.
8,732,487 B2 5/2014 Goraczko et al.
8,749,193 B1 6/2014 Sullivan
8,751,845 B2 6/2014 Assad et al.
8,768,567 B2 7/2014 Diab
8,795,875 B2 8/2014 Lee et al.
8,803,479 B2 8/2014 Kim
8,805,764 B1 8/2014 Rhines et al.
8,829,847 B2 9/2014 Eaton et al.
8,833,667 B2 9/2014 Ahn et al.
8,847,551 B2 9/2014 Coe et al.
8,898,485 B2 11/2014 Scott et al.
8,922,329 B2 12/2014 Davis et al.
8,949,629 B2 2/2015 Chakra et al.
8,958,854 B1 2/2015 Morley et al.
8,962,188 B2 2/2015 Zhamu et al.
9,285,851 B2 3/2016 Hodges et al.
9,475,398 B2 10/2016 Borhan et al.
9,696,782 B2 * 7/2017 Chandra ............... G06F 1/3212
9,748,765 B2 8/2017 Huang et al.
9,760,138 B2 9/2017 Huang et al.
9,793,570 B2 10/2017 Chandra et al.
9,939,862 B2 4/2018 Badam et al.
10,061,366 B2 8/2018 Badam et al.
2001/0010456 A1 8/2001 Kaite et al.
2001/0013767 A1 8/2001 Takemoto
2001/0044332 A1 11/2001 Yamada et al.
2002/0155327 A1 10/2002 Faris
2003/0117143 A1 6/2003 Okada
2003/0149904 A1 8/2003 Kim
2004/0003300 A1 1/2004 Malueg et al.
2004/0095096 A1 5/2004 Melton et al.
2004/0101744 A1 5/2004 Suzuki
2004/0198468 A1 10/2004 Patel et al.
2004/0204183 A1 10/2004 Lencevicius
2005/0189949 A1 9/2005 Shimizu et al.
2005/0258686 A1 11/2005 Hiramitsu et al.
2006/0028167 A1 2/2006 Czubay et al.
2006/0066285 A1 3/2006 Minamiura
2006/0087291 A1 4/2006 Yamauchi
2006/0176017 A1 8/2006 Waguespack
2006/0187072 A1 8/2006 Bruce et al.

(56) References Cited

U.S. PATENT DOCUMENTS

2006/0284618 A1 12/2006 Cho, II et al.
2007/0007823 A1 1/2007 Huang et al.
2007/0050647 A1 3/2007 Conroy
2007/0103114 A1 5/2007 Hoffman
2007/0252552 A1 11/2007 Walrath
2008/0024007 A1 1/2008 Budampati et al.
2008/0075367 A1 3/2008 Winn et al.
2008/0082851 A1 4/2008 Zettler
2008/0137989 A1 6/2008 Ng et al.
2008/0176608 A1 7/2008 Budampati et al.
2008/0201587 A1 8/2008 Lee
2008/0218125 A1 9/2008 Bansal et al.
2008/0234956 A1 9/2008 Mizuno et al.
2008/0263375 A1 10/2008 Sundstrom et al.
2009/0006878 A1 1/2009 Borghetti et al.
2009/0007128 A1 1/2009 Borghetti et al.
2009/0016765 A1 1/2009 Honda
2009/0018785 A1 1/2009 Huseth et al.
2009/0085553 A1 4/2009 Kumar et al.
2009/0295397 A1 12/2009 Barsukov
2010/0070334 A1 3/2010 Monteverde
2010/0106994 A1 4/2010 Challener et al.
2010/0121587 A1 5/2010 Vian et al.
2010/0121588 A1 5/2010 Elder et al.
2010/0123436 A1 5/2010 Herrod et al.
2010/0164430 A1 7/2010 Lu et al.
2010/0174928 A1 7/2010 Borghetti et al.
2010/0201320 A1 8/2010 Coe et al.
2010/0213897 A1 8/2010 Tse
2010/0235007 A1 9/2010 Constien et al.
2010/0304207 A1 12/2010 Krammer
2010/0332876 A1 12/2010 Fields et al.
2011/0016333 A1 1/2011 Scott et al.
2011/0018679 A1 1/2011 Davis et al.
2011/0025258 A1 2/2011 Kim et al.
2011/0025259 A1 2/2011 Toya et al.
2011/0057617 A1 3/2011 Finberg et al.
2011/0115830 A1 5/2011 Lee et al.
2011/0161690 A1 6/2011 Lin et al.
2011/0171502 A1 7/2011 Kottenstette et al.
2011/0181242 A1 7/2011 Lee
2011/0187309 A1 8/2011 Chan et al.
2011/0234166 A1 9/2011 Liu
2011/0250512 A1 10/2011 Friesen et al.
2011/0260686 A1 10/2011 Ford
2011/0264899 A1 10/2011 Evans et al.
2011/0309838 A1 12/2011 Lin
2012/0004875 A1 1/2012 Maeda et al.
2012/0018679 A1 1/2012 Davis et al.
2012/0040210 A1 2/2012 Hermann
2012/0046892 A1 2/2012 Fink
2012/0047379 A1 2/2012 Chen et al.
2012/0058805 A1 3/2012 Yoo
2012/0074893 A1 3/2012 Cole
2012/0079357 A1 3/2012 Salsbery et al.
2012/0098705 A1 4/2012 Yost et al.
2012/0102407 A1 4/2012 Benario
2012/0102504 A1 4/2012 Iyer
2012/0109519 A1 5/2012 Uyeki
2012/0119705 A1 5/2012 Eberhard et al.
2012/0119746 A1 5/2012 Macris
2012/0144215 A1 6/2012 Naffziger et al.
2012/0144221 A1 6/2012 Naffziger et al.
2012/0150247 A1 6/2012 Meier et al.
2012/0153899 A1 6/2012 Marschalkowski et al.
2012/0188714 A1 7/2012 Von Borck et al.
2012/0309455 A1 12/2012 Klose et al.
2012/0319652 A1 12/2012 Namou et al.
2012/0324578 A1 12/2012 Seinfeld et al.
2012/0326671 A1 12/2012 Krause
2013/0009604 A1 1/2013 Bhardwaj et al.
2013/0038274 A1 2/2013 Forsythe
2013/0043827 A1 2/2013 Weinstein et al.
2013/0099746 A1 4/2013 Nork et al.
2013/0106357 A1 5/2013 Girard et al.
2013/0140902 A1 6/2013 Rich et al.
2013/0143100 A1 6/2013 Bennis et al.
2013/0162430 A1 6/2013 Scherzer et al.
2013/0181511 A1 7/2013 Stewart et al.
2013/0191625 A1 7/2013 Mullens et al.
2013/0191662 A1 7/2013 Ingrassia, Jr. et al.
2013/0221926 A1 8/2013 Furtner
2013/0226486 A1 8/2013 Henderson et al.
2013/0257377 A1 10/2013 Diamond et al.
2013/0262899 A1 10/2013 Frantz et al.
2013/0275794 A1 10/2013 Annavaram et al.
2013/0325379 A1 12/2013 Nakamura
2013/0346001 A1 12/2013 Park et al.
2013/0346762 A1 12/2013 Hodges et al.
2014/0015488 A1 1/2014 Despesse
2014/0021887 A1 1/2014 Keily et al.
2014/0038054 A1 2/2014 Tojigamori et al.
2014/0043010 A1 2/2014 Salem
2014/0062388 A1 3/2014 Kim
2014/0082384 A1 3/2014 De Cesare et al.
2014/0093779 A1 4/2014 Myung et al.
2014/0095003 A1 4/2014 Phillips et al.
2014/0125344 A1 5/2014 Knight et al.
2014/0155100 A1 6/2014 Baldasare et al.
2014/0162112 A1 6/2014 Ugaji et al.
2014/0181551 A1 6/2014 Rahal-Arabi et al.
2014/0186700 A1 7/2014 Bae et al.
2014/0191693 A1 7/2014 Funaba et al.
2014/0203780 A1 7/2014 Hu et al.
2014/0253023 A1 9/2014 Paryani et al.
2014/0265604 A1 9/2014 Mergener
2014/0266061 A1 9/2014 Wachal
2014/0278074 A1 9/2014 Annapureddy et al.
2014/0288737 A1 9/2014 Ryu et al.
2014/0312828 A1 10/2014 Vo et al.
2014/0375252 A1 12/2014 Ford
2014/0376137 A1 12/2014 Wang et al.
2015/0004473 A1 1/2015 Lim et al.
2015/0020016 A1 1/2015 Hanumara et al.
2015/0084602 A1 3/2015 Sawyers et al.
2015/0089261 A1 3/2015 Segawa et al.
2015/0125743 A1 5/2015 Edwards et al.
2015/0188188 A1 7/2015 Zhang et al.
2015/0194707 A1 7/2015 Park
2015/0207344 A1 7/2015 Wang et al.
2015/0309547 A1 10/2015 Huang et al.
2015/0329003 A1 11/2015 Li et al.
2015/0339415 A1 11/2015 Klein et al.
2015/0351037 A1 12/2015 Brown et al.
2016/0066266 A1 3/2016 Law et al.
2016/0114696 A1 4/2016 Eifert et al.
2016/0231387 A1 8/2016 Hodges et al.
2016/0231801 A1 8/2016 Chandra et al.
2016/0240891 A1 8/2016 Hodges et al.
2016/0241048 A1 8/2016 Badam et al.
2016/0248125 A1 8/2016 Huang et al.
2016/0248266 A1 8/2016 Ferrese et al.
2016/0254664 A1 9/2016 Huang et al.
2016/0275400 A1 9/2016 Hodges et al.
2017/0108906 A1 4/2017 Chandra et al.
2017/0139459 A1 5/2017 Badam et al.
2017/0139465 A1 5/2017 Badam
2017/0162899 A1 6/2017 Chandra et al.
2017/0317493 A1 11/2017 Huang et al.
2017/0331138 A1 11/2017 Kamiya et al.
2018/0095141 A1 4/2018 Wild et al.

FOREIGN PATENT DOCUMENTS

CN 102230953 11/2011
CN 202424488 9/2012
CN 103226184 7/2013
CN 103683255 3/2014
DE 102012209660 A1 12/2013
EP 1798100 6/2007
EP 1906295 4/2008
EP 2296246 3/2011
EP 2590050 5/2013
EP 2682840 1/2014

(56) References Cited

FOREIGN PATENT DOCUMENTS

| | | |
|---|---|---|
| GB | 2446168 | 8/2008 |
| JP | H0410366 | 1/1992 |
| JP | H0684544 | 3/1994 |
| JP | 2009278754 | 11/2009 |
| JP | 2010067436 | 3/2010 |
| JP | 2012243463 | 12/2012 |
| KR | 20070095689 | 10/2007 |
| KR | 20090064813 | 6/2009 |
| KR | 20140140906 | 12/2014 |
| WO | WO-9401914 | 1/1994 |
| WO | WO-9933124 | 7/1999 |
| WO | WO-03021409 | 3/2003 |
| WO | WO-2007127788 | 11/2007 |
| WO | WO-2008133951 | 11/2008 |
| WO | WO-2011127251 | 10/2011 |
| WO | WO-2012109048 | 8/2012 |
| WO | WO-2012140401 | 10/2012 |
| WO | WO-2013019899 | 2/2013 |
| WO | WO-2013052678 | 4/2013 |
| WO | WO-2013060802 | 5/2013 |
| WO | WO-2013145000 | 10/2013 |
| WO | WO-2013163695 | 11/2013 |
| WO | WO-2014098037 | 6/2014 |
| WO | WO-2015029332 | 3/2015 |
| WO | WO-2015123290 | 8/2015 |
| WO | WO-2016149702 | 9/2016 |
| WO | WO-2016197109 | 12/2016 |

OTHER PUBLICATIONS

"Final Office Action", U.S. Appl. No. 14/943,967, dated Oct. 19, 2017, 10 pages.
"Foreign Office Action", EP Application No. 15719556.1, dated Sep. 14, 2017, 4 pages.
"Notice of Allowance", U.S. Appl. No. 14/941,416, dated Nov. 27, 2017, 7 pages.
"Second Written Opinion", Application No. PCT/US2016/055238, dated Sep. 27, 2017, 6 pages.
"Second Written Opinion", Application No. PCT/US2016/063741, dated Sep. 29, 2017, 6 pages.
"Corrected Notice of Allowance", U.S. Appl. No. 14/617,719, dated Jun. 8, 2017, 2 pages.
"Corrected Notice of Allowance", U.S. Appl. No. 14/633,009, dated Jun. 7, 2017, 4 pages.
"Final Office Action", U.S. Appl. No. 14/885,858, dated Jun. 9, 2017, 22 pages.
"International Preliminary Report on Patentability", Application No. PCT/US2016/016669, dated Mar. 10, 2017, 7 pages.
"International Preliminary Report on Patentability", Application No. PCT/US2016/016670, dated May 12, 2017, 7 pages.
"Non-Final Office Action", U.S. Appl. No. 14/617,751, dated Jun. 30, 2017, 11 pages.
"Notice of Allowance", U.S. Appl. No. 14/959,265, dated Jun. 29, 2017, 5 pages.
"Google Now", Retrieved on: Aug. 13, 2015—Available at: http://www.google.com/landing/now/, 1 page.
"Skoda Navigation", Retrieved from <https://skoda.garmin.com/skoda/site/productOverview> on Oct. 27, 2014, Jan. 23, 2014, 1 page.
"Ford Developers Look to Use Google Prediction API to Optimize Energy Efficiency", Retrieved from <http://corporate.ford.com/news-center/press-releases-detail/pr-ford-developers-look-to-use-google-34591> on Nov. 11, 2014, May 10, 2011, 1 page.
"International Search Report and Written Opinion", Application No. PCT/US2016/016037, dated Apr. 8, 2016, 10 pages.
"International Search Report and Written Opinion", Application No. PCT/US2016/016033, dated May 9, 2016, 10 pages.
"International Search Report and Written Opinion", Application No. PCT/US2016/016671, dated May 11, 2016, 10 pages.
"International Search Report and Written Opinion", Application No. PCT/US2015/026052, dated Jul. 23, 2015, 10 pages.
"Non-Final Office Action", U.S. Appl. No. 14/617,751, dated Aug. 25, 2016, 10 pages.
"Final Office Action", U.S. Appl. No. 14/617,719, dated Dec. 12, 2016, 10 pages.
"Non-Final Office Action", U.S. Appl. No. 14/943,967, dated Jan. 3, 2017, 11 pages.
"Non-Final Office Action", U.S. Appl. No. 12/503,605, dated Jan. 12, 2012, 11 pages.
"International Search Report and Written Opinion", Application No. PCT/US2016/055238, dated Jan. 19, 2017, 11 pages.
"Final Office Action", U.S. Appl. No. 14/617,751, dated Mar. 10, 2017, 11 pages.
"International Search Report and Written Opinion", Application No. PCT/US2016/015493, dated Apr. 4, 2016, 11 pages.
"iFixit iPad Air 2 Teardown", Retrieved on: Aug. 13, 2015—Available at: https://www.ifixit.com/Teardown/iPad+Air+2+Teardown/30592, 12 pages.
"Final Office Action", U.S. Appl. No. 12/503,605, dated Sep. 20, 2012, 12 pages.
"iFixit Samsung Galaxy Note 10.1 Teardown", Retrieved on: Aug. 13, 2015—Available at: https://www.ifixit.com/Teardown/Samsung+Galaxy+Note+10.1+Teardown/10144, 13 pages.
"International Search Report and Written Opinion", Application No. PCT/US2016/063741, dated Mar. 22, 2017, 13 pages.
"Non-Final Office Action", U.S. Appl. No. 14/941,416, dated May 17, 2017, 13 pages.
"MacBook", Retrieved on: Aug. 13, 2015—Available at: http://www.apple.com/macbook/design/, 14 pages.
"Non-Final Office Action", U.S. Appl. No. 12/503,605, dated Oct. 4, 2013, 14 pages.
"International Search Report and Written Opinion", Application No. PCT/US2016/060415, dated Feb. 22, 2017, 16 pages.
"International Search Report and Written Opinion", Application No. PCT/US2016/016034, dated Apr. 14, 2016, 16 pages.
"iFixit Microsoft Surface Pro 3 Teardown", Retrieved on: Aug. 13, 2015—Available at: https://www.ifixit.com/Teardown/Microsoft+Surface+Pro+3+Teardown/26595, 17 pages.
"Non-Final Office Action", U.S. Appl. No. 14/885,858, dated Oct. 7, 2016, 18 pages.
"Maxim-Parametric Search Product Table", Retrieved on: Aug. 13, 2015 Available at: http://para.maximintegrated.com/en/results.mvp?fam=batt_stat295=Fuel%26nbsp%3BGauge&1379=ModelGauge, 2 pages.
"Arbin BT-2000 Battery Testing Equipment", Retrieved on: Aug. 13, 2015—Available at: http://www.arbin.com/products/battery, 2 pages.
"MACCOR-Model 4200", Retrieved on: Aug. 13, 2015—Available at: http://www.maccor.com/Products/Model4200.aspx, 2 pages.
"Corrected Notice of Allowance", U.S. Appl. No. 14/617,719, dated May 30, 2017, 2 pages.
"Advanced Configuration and Power Interface", Retrieved from <http://www.acpi.info/> on Nov. 3, 2014, Jul. 23, 2014, 2 pages.
"Anode Materials", Retrieved from <http://www.targray.com/li-ion-battery/anode-materials> on Nov. 3, 2014, Nov. 1, 2010, 2 pages.
"Anode active material for Lithium-ion-battery-Gramax", Retrieved from <http://www.ogc.co.jp/e/products/battery/> on Nov. 3, 2014, 2014, 2 pages.
"International Search Report and Written Opinion", Application No. PCT/US2016/016670, dated Sep. 14, 2016, 23 pages.
"Non-Final Office Action", U.S. Appl. No. 14/626,518, dated Mar. 27, 2017, 24 pages.
"International Search Report and Written Opinion", Application No. PCT/US2016/016669, dated Sep. 30, 2016, 24 pages.
"Non-Final Office Action", U.S. Appl. No. 14/626,600, dated Feb. 13, 2017, 27 pages.
"DS2782 Stand-Alone Fuel Gauge IC", Retrieved From: <http://www.maximintegrated.com/en/products/battery-management/DS2782.html/tb_tab0> Aug. 6, 2015, 3 pages.
"Non-Final Office Action", U.S. Appl. No. 14/624,825, dated Nov. 18, 2016, 33 pages.

(56) References Cited

OTHER PUBLICATIONS

"Cell Trak", Retrieved from <http://celltraksystems.com/monitoring_parameters.html> on Nov. 4, 2014, Aug. 16, 2013, 4 pages.
"Battery and Power Subsystem Hardware Design", Retrieved From: <https://msdn.microsoft.com/en-us/library/windows/hardware/dn481323(v=vs.85).aspx> Aug. 5, 2015, Jun. 30, 2014, 4 pages.
"Hey Siri, what's the Best Sushi Place in Town?", Retrieved on: Aug. 13, 2015 Available at: https://www.apple.com/ios/siri/, 5 pages.
"Notice of Allowance", U.S. Appl. No. 14/617,719, dated Mar. 1, 2017, 5 pages.
"Non-Final Office Action", U.S. Appl. No. 14/624,808, dated May 23, 2017, 5 pages.
"Notice of Allowance", U.S. Appl. No. 14/262,205, dated May 31, 2017, 5 pages.
"Second Written Opinion", Application No. PCT/US2016/015493, dated Jul. 28, 2016, 5 pages.
"Second Written Opinion", Application No. PCT/US2016/016037, dated Sep. 1, 2016, 5 pages.
"Notice of Allowance", U.S. Appl. No. 13/530,130, dated Nov. 6, 2015, 5 pages.
"The PASCAL Visual Object Classes Challenges 2008 (VOC2008) Results", Retrieved from <<http://pascallin.ecs.soton.ac.uk/challengesNOC/voc2008/results/index.shtml>> on Jun. 19, 2009, Jun. 22, 2009, 5 pages.
"Notice of Allowance", U.S. Appl. No. 12/503,605, dated Jul. 23, 2014, 5 pages.
"International Preliminary Report on Patentability", Application No. PCT/US2016/016671, dated Feb. 22, 2017, 6 pages.
"Restriction Requirement", U.S. Appl. No. 14/624,808, dated Feb. 23, 2017, 6 pages.
"Second Written Opinion", Application No. PCT/US2015/026052, dated Mar. 29, 2016, 6 pages.
"International Preliminary Report on Patentability", Application No. PCT/US2016/015493, dated Apr. 21, 2017, 6 pages.
"International Preliminary Report on Patentability", Application No. PCT/US2016/016033, dated Nov. 7, 2016, 6 pages.
"Second Written Opinion", Application No. PCT/US2016/016670, dated Nov. 18, 2016, 6 pages.
"International Preliminary Report on Patentability", Application No. PCT/US2016/016037, dated Nov. 24, 2016, 6 pages.
"Non-Final Office Action", U.S. Appl. No. 14/262,205, dated Dec. 23, 2016, 6 pages.
"Boltzmann Machines and Deep Belief Networks", Retrieved from <http://plearn.berlios.de/machine_learning/node4.html> on Jun. 22, 2009, 7 pages.
"Mophie Juice Pack Helium", Retrieved on: Aug. 13, 2015—Available at: http://www.mophie.com/shop/iphone-5/juice-pack-helium-iphone-5, 7 pages.
"Notice of Allowance", U.S. Appl. No. 14/633,009, dated Apr. 18, 2017, 7 pages.
"Final Office Action", U.S. Appl. No. 13/530,130, dated Apr. 22, 2015, 7 pages.
"Non-Final Office Action", U.S. Appl. No. 14/633,009, dated Dec. 1, 2016, 7 pages.
"On-the-Go and Embedded Host Supplement to the USB Revision 2.0 Specification", Retrieved from <<http://www.usb.org/developers/onthego/USB_OTG_and_EH_2-0.pdf>> on Sep. 21, 2009, May 8, 2009, 79 pages.
"Battery Anodes", Retrieved on Sep. 23, 2015 Available at: http://www.emc2.cornell.edu/content/view/battery-anodes.html, 8 pages.
"Surface Power Cover", Retrieved on: Aug. 13, 2015—Available at: http://www.microsoft.com/surface/en-us/support/hardware-and-drivers/power-cover?os=windows-10, 8 pages.
"Understanding Lithium-ion-Battery University", Retrieved on: Sep. 23, 2015 Available at: http://batteryuniversity.com/learn/article/understanding_lithium_ion, 8 pages.
"Second Written Opinion", Application No. PCT/US2016/016034, dated Jan. 17, 2017, 8 pages.
"Non-Final Office Action", U.S. Appl. No. 14/959,265, dated Apr. 21, 2017, 8 pages.
"International Preliminary Report on Patentability", Application No. PCT/US2015/026052, dated Jul. 27, 2016, 8 pages.
"Non-Final Office Action", U.S. Appl. No. 13/530,130, dated Oct. 3, 2014, 8 pages.
"Anker", Retrieved on: Aug. 13, 2015—Available at: http://www.ianker.com/ExternalBatteries/category-c1-sl, 9 pages.
"Qualcomm Quick Charge", Retrieved on: Aug. 13, 2015—Available at: https://www.qualcomm.com/products/snapdragon/quick-charge, 9 pages.
"Non-Final Office Action", U.S. Appl. No. 14/617,719, dated Aug. 22, 2016, 9 pages.
Ackley,"A Learning Algorithm for Boltzmann Machines", Cognitive Science 9, pp. 147-169, 1985, 23 pages.
Albertus,"Experiments on and Modeling of Positive Electrodes with Multiple Active Materials for Lithium-Ion Batteries", In Journal of the Electrochemical Society, vol. 156, Issue 7, May 14, 2009, 1 page.
Allen,"Microfabricated Fast-Charging Energy Storage Devices", Retrieved from <http://yprize.upenn.edu/technology/fast-charging-batteries> on Nov. 3, 2014, 2014, 2 pages.
Balan,"The Case for Cyber Foraging", In Proceedings of the 10th workshop on ACM SIGOPS European Workshop, Jul. 2002, 6 pages.
Balasubramanian,"Energy Consumption in Mobile Phones: A Measurement Study and Implications for Network Applications", Proceedings of the 9th ACM SIGCOMM conference on Internet measurement conference (IMC), Retrieved at «http://www.cs.umass.edu/-arunab/paper/tailender-imc09.pdf», Nov. 4, 2009, 14 Pages.
Banerjee,"Users and Batteries: Interactions and Adaptive Energy Management in Mobile Systems", In Proceedings of the 9th International Conference on Ubiquitous Computing, Sep. 2007, 18 pages.
Bashash,"Battery Health-conscious Plug-in Hybrid Electric Vehicle Grid Demand Prediction", In Proceedings of the ASME Dynamic Systems and Control Conference, Sep. 13, 2010, 9 pages.
Benini,"Battery-Driven Dynamic Power Management of Portable Systems", In Proceedings 13th International Symposium on System Synthesis, Sep. 20, 2000, 6 pages.
Benini,"Extending Lifetime of Portable Systems by Battery Scheduling", In Proceedings of the conference on Design, automation and test in Europe, Mar. 13, 2001, 5 pages.
Benini,"Scheduling Battery Usage in Mobile Systems", In IEEE Transactions on Very Large Scale Integration Systems, vol. 11, Issue 6, Dec. 2003, pp. 1136-1143.
Benini,"Discharge Current Steering for Battery Lifetime Optimization", In Proceedings of the International Symposium on Low Power Electronics and Design, Aug. 12, 2002, pp. 118-123.
Bickford,"Security versus Energy Tradeoffs in Host-Based Mobile Malware Detection", In Proceedings of 9th International Conference on Mobile Systems, Applications, and Services, Jun. 28, 2011, pp. 225-238.
Borkar,"Intel Look Inside", Available at: http://www.intel.com/content/dam/www/public/us/en/documents/presentation/advancing-moores-law-in-2014-presentation.pdf, Aug. 11, 2014, 68 pages.
Carroll,"An Analysis of Power Consumption in a Smartphone", In Proceedings of USENIX Annual Technical Conference, Jun. 23, 2010, 14 pages.
Chan,"A New Battery Model for use with Battery Energy Storage Systems and Electric Vehicles Power Systems", In IEEE Power Engineering Society Winter Meeting, vol. 1, Jan. 23, 2000, 6 pages.
Chang,"The State of Charge Estimating Methods for Battery: A Review", In Proceeding of the ISRN Applied Mathematics, May 12, 2013, 8 pages.
Chen,"An Accurate Electrical Battery Model Capable of Predicting Runtime and I-V Performance", In Proceeding of the IEEE Transactions on Energy Conversion, vol. 21, Issue 2, Jun. 5, 2006, 8 pages.
Chiasserini,"Energy Efficient Battery Management", In IEEE Journal on Selected Areas in Communications, vol. 19, Issue 7, Jul. 2001, pp. 1235-1245.
Chiasson,"Estimating the State of Charge of a Battery", In Proceedings of IEEE Transactions on Control Systems Technology, vol. 13, Issue 3, Apr. 25, 2005, 6 pages.

(56) References Cited

OTHER PUBLICATIONS

Chikkannanavara,"A Review of Blended Cathode Materials for Use in Li-Ion Batteries", In Journal of Power Sources, vol. 248, Feb. 15, 2015, 2 Pages.

Clark,"These solar-Powered Benches Charge Phones for Free", Retrieved from <http://www.wired.co.uk/news/archive/2014-07/09/soofa> on Nov. 3, 2014, Jul. 9, 2014, 4 pages.

Clark,"New Tech Allows Lithium Batteries to Charge Faster, and Hold Charge Longer", Available at: http://www.gizmag.com/lithium-batteries-charge-faster-hold-longer/20550/, Oct. 20, 2015, 8 pages.

Cosby,"Multiple battery chemistries, single device!", Retrieved From: <https://e2e.ti.com/blogs_/b/fullycharged/archive/2015/06/16/multiple-battery-chemistries-single-device> Aug. 6, 2015, Jun. 16, 2015, 3 pages.

Dong,"Self-Constructive High-Rate System Energy Modeling for Battery-Powered Mobile Systems", In Proceedings of the 9th international conference on Mobile systems, applications, and services, Jun. 28, 2011, 14 pages.

Erdinc,"A Dynamic Lithium-Ion Battery Model considering the Effects of Temperature and Capacity Fading", In Proceedings of International Conference on Clean Electrical Power, Sep. 6, 2009, pp. 383-386.

Fairley,"Software Looks at the Road Ahead to Boost Hybrid-Car Efficiency", Retrieved from <http://spectrum.ieee.org/transportation/systems/software-looks-at-the-road-ahead-to-boost-hybridcar-efficiency> on Nov. 11, 2014, Feb. 3, 2009, 1 page.

Flinn,"Managing Battery Lifetime with Energy-Aware Adaptation", In Journal of ACM Transactions on Computer Systems, vol. 22, Issue 2, May 2004, 43 pages.

Flinn,"Energy-Aware Adaptation for Mobile Applications", In Proceedings of the Seventeenth ACM Symposium on Operating Systems Principles, Dec. 1999, pp. 48-63.

Fonseca,"Quanto: Tracking Energy in Networked Embedded Systems", In Proceedings of 8th USENIX Conference on Operating Systems Design and Implementation, Dec. 8, 2008, 16 pages.

Fox,"Automatic Construction of Efficient Multiple Battery Usage Policies", In Proceedings of the Twenty-Second International Joint Conference on Artificial Intelligence, Jun. 11, 2011, 6 pages.

Freund,"Unsupervised Learning of Distributions on Binary Vectors Using Two Layer Networks", Baskin Center for Computer Engineering & Information Sciences, University of California, Santa Cruz, UCSC-CRL-94-25, Jun. 22, 1994, 41 pages.

Gao,"Dynamic Lithium-Ion Battery Model for System Simulation", In Journal of IEEE Transactions on Components and Packaging Technologies, vol. 25, No. 3, Sep. 2002, pp. 495-505.

Gonder,"Route-Based Control of Hybrid Electric Vehicles", In SAE Technical Paper, Apr. 14, 2008, 11 pages.

Gong,"Trip Based Optimal Power Management of Plug-in Hybrid Electric Vehicle with Advanced Traffic Modeling", In SAE International Journal of Engines, Apr. 14, 2008, 1 page.

Gong,"Trip Based Optimal Power Management of Plug-in Hybrid Electric Vehicles Using Gas-Kinetic Traffic Flow Model", In Proceedings of American Control Conference, Jun. 11, 2008, 6 pages.

Groiß,"The Influence of Temperature on the Operation of Batteries and Other Electrochemical Energy Storage Systems", Retrieved from <http://www.basytec.de/Literatur/temperature/DE_2002.htm> on Nov. 3, 2014, Jan. 8, 2003, 7 pages.

Gu,"Thermal-Electrochemical Modeling of Battery Systems", In Journal of Electrochemical Society, Jan. 28, 2000, 41 pages.

Hayakawa,"Incentive Based Multi-Objective Optimization in Electric Vehicle Navigation including Battery Charging", In Proceedings of the International Federation of Automatic Control, Aug. 24, 2014, 7 pages.

He,"Vehicle-Infrastructure Integration-Enabled Plug-in Hybrid Electric Vehicles for Optimizing Energy Consumption", In Transportation Research Board 90th Annual Meeting Compendium of Papers DVD, Jan. 23, 2011, 14 pages.

He,"State-of-Charge Estimation of the Lithium-Ion Battery Using an Adaptive Extended Kalman Filter Based on an Improved Thevenin Model", In Proceedings of IEEE Transactions on Vehicular Technology, vol. 60, Issue 4, May 2011, pp. 1461-1469.

Heath,"Code Transformations for Energy Efficient Device Management", In Journal of IEEE Transactions on Computers, vol. 53, Issue 8, Aug. 2004, 37 pages.

Higgins,"Informed Mobile Prefetching", In Proceedings of the 10th international conference on Mobile systems, applications, and services, Jun. 25, 2012, pp. 155-168.

Hinton,"A Fast Learning Algorithm for Deep Belief Nets", Retrieved from <<http://www.cs.toronto.edu/-hinton/absps/fastnc.pdf>> on Jun. 19, 2009, 2006, 16 pages.

Johnson,"Temperature Dependent Battery Models for High-Power Lithium-Ion Batteries", In 17th Annual Electric Vehicle Symposium, Oct. 15, 2000, 17 pages.

Jongerden,"Maximizing System Lifetime by Battery Scheduling", In Proceeding of the IEEE/IFIP International Conference on Dependable Systems & Networks, Jun. 29, 2009, 10 pages.

Jongerden,"Lifetime Improvement by Battery Scheduling", In Proceedings of the 16th international GI/ITG conference on Measurement, Modelling, and Evaluation of Computing Systems and Dependability and Fault Tolerance, Mar. 19, 2012, 15 pages.

Katsargyri,"Optimally Controlling Hybrid Electric Vehicles using Path Forecasting", In Proceedings of American Control Conference, Jun. 10, 2009, 6 pages.

Keshav,"Energy efficient scheduling in 4G smart phones for Mobile Hotspot Application", In Proceedings: National Conference on Communications, Feb. 3, 2012, 5 Pages.

Kohli,"Robust Higher Order Potentials for Enforcing Label Consistency", Retrieved from <<http://research.microsoft.com/en-us/um/people/pkohli/papers/klt_cvpr08. pdf>> on Jun. 19, 2009, Jan. 2009, 8 pages.

Korhonen,"Predicting Mobile Device Battery Life", In Master's Thesis, Feb. 28, 2011, 62 pages.

Koushanfar,"Hybrid Heterogeneous Energy Supply Networks", In IEEE International Symposium on Circuits and Systems, May 15, 2011, 4 pages.

Krumm,"Where Will They Turn: Predicting Turn Proportions at Intersections", In Journal of Personal and Ubiquitous Computing, vol. 14, Issue 7, Oct. 2010, 14 pages.

Krumm,"Predestination: Where Do You Want to Go Today?", In Journal of Computer, vol. 40, Issue 4, Apr. 2007, 4 pages.

Krumm,"Predestination: Inferring Destinations from Partial Trajectories", UbiComp 2006: The Eighth International Conference on Ubiquitous Computing, Sep. 17-21, 2006, Orange County, CA, retrieved from <http://research.microsoft.com/en-us/um/people/horvitzlpredestination.pdf> on Feb. 5, 2009, Sep. 17, 2006, 18 pages.

Kumar,"Discriminative Random Fields", International Journal of Computer Vision 68(2), 179-201, 2006, 23 pages.

Laasonen,"Adaptive On-Device Location Recognition", In Proceedings of the 2nd International Conference on Pervasive Computing, Researchers and Practitioners, Apr. 2004, pp. 287-304.

LaMarca,"Place Lab: Device Positioning Using Radio Beacons in the Wild", In Proceedings of Pervasive 2005, Munich, Germany, retrieved from <http://www.placelab.org/publications/pubs/pervasive-placelab-2005-final.pdf> on Feb. 5, 2009, May 2005, 18 pages.

Langari,"Intelligent Energy Management Agent for a Parallel Hybrid Vehicle—Part I: System Architecture and Design of the Driving Situation Identification Process", In IEEE Transactions on Vehicular Technology, vol. 54, Issue 3, May 23, 2005, 10 pages.

Larochelle,"An Empirical Evaluation of Deep Architectures on Problems with Many Factors of Variation", University of Montreal, CIAR Summer School, Aug. 9, 2007, 24 pages.

Lee,"Sparse Deep Belief Net Model for Visual Area V2", Computer Science Department, Stanford University, Retrieved from <<http://books.nips.cc/papers/files/nips20/NIPS20070934.pdf>> on Jun. 19, 2009, 8 pages.

Lu,"A Scalable and Programmable Architecture for the Continuous Restricted Boltzmann Machine in VLSI", The Department of Electrical Engineering, The National Tsing-Hua University, Taiwan, IEEE, 2007, pp. 1297-1300, 2007, 4 pages.

(56) References Cited

OTHER PUBLICATIONS

Mak,"Infrastructure Planning for Electric Vehicles with Battery Swapping", In Journal of Academic Science, vol. 59, Issue 7, Jul. 2013, 33 pages.
Man,"Towards a Hybrid Approach to SoC Estimation for a Smart Battery Management System (BMS) and Battery Supported Cyber-Physical Systems (CPS)", In Proceeding of the 2nd Baltic Congress on Future Internet Communications, Apr. 25, 2012, 4 pages.
Mandal,"IntellBatt: Towards Smarter Battery Design", In Proceedings of 45th ACM/IEEE Design Automation Conference, Jun. 8, 2008, 6 pages.
Miettinen,"Energy Efficiency of Mobile Clients in Cloud Computing", In Proceedings of the 2nd USENIX conference on Hot topics in cloud computing, Jun. 22, 2010, 7 pages.
Miliche,"A First Experimental Investigation of the Practical Efficiency of Battery Scheduling", In Proceedings of 23th International Conference on Architecture of Computing Systems Feb. 22, 2010, 6 pages.
MIT"Reality Commons", Retrieved from <http://realitycommons.media.mit.edu/> on Nov. 3, 2014, 2014, 2 pages.
Mittal,"Empowering Developers to Estimate App Energy Consumption", In Proceedings of the 18th annual international conference on Mobile computing and networking, Aug. 22, 2012, pp. 317-328.
Musardo,"A-ECMS: An Adaptive Algorithm for Hybrid Electric Vehicle Energy Management", In Proceedings of the 44th IEEE Conference on Decision and Control, and the European Control Conference, Dec. 12, 2005, 8 pages.
Osindero,"Modeling Image Patches with a Directed Hierarchy of Markov Random Fields", Retrieved from <<http://www.cs.toronto.edu/-hinton/absps/lateral.pdf>> on Jun. 19, 2009, 8 pages.
Panigrahi,"Battery Life Estimation of Mobile Embedded Systems", In Proceeding of the Fourteenth International Conference on VLSI Design, Jan. 2001, 7 pages.
Pathak,"Fine-Grained Power Modeling for Smartphones using System Call Tracing", In Proceedings of the sixth conference on Computer systems, Apr. 10, 2011, pp. 153-168.
Pathak,"Where is the Energy Spent Inside My App? Fine Grained Energy Accounting on Smartphones with Eprof", In Proceedings of the 7th ACM European conference on Computer Systems, Apr. 10, 2012, pp. 29-42.
Prigg,"Charged in 30 seconds: Israeli Firm Claims Battery Breakthrough that could Change the way we Power Phones and Laptops", Retrieved from <http://www.dailymail.co.uk/sciencetech/article-2599243/Charged-30-seconds-Israeli-firm-claims-battery-breakthrough-change-way-charge-phones-laptops.html> on Nov. 3, 2014, Apr. 7, 2014, 6 pages.
Qian,"Profiling Resource Usage for Mobile Applications: A Cross-layer Approach", In Proceedings of the 9th international conference on Mobile systems, applications, and services, Jun. 28, 2011, 14 pages.
Ranzato,"Sparse Feature Learning for Deep Belief Networks", Retrieved from <<http://yann.lecun.com/exdb/publis/pdf/ranzato-nips-07 .pdf>> on Jun. 19, 2009, 8 pages.
Rao,"Battery Modeling for Energy-Aware System Design", In Journal of Computer, vol. 36, Issue 12, Dec. 2012, 11 pages.
Rao,"Analysis of Discharge Techniques for Multiple Battery Systems", In Proceedings of the International Symposium on Low Power Electronics and Design, Aug. 25, 2003, pp. 44-47.
Ravi,"Context-aware Battery Management for Mobile Phones: A Feasibility Study", In Proceedings of IEEE International Conference on Pervasive Computing and Communications, 2006, 16 pages.
Ravi,"Context-aware Battery Management for Mobile Phones", Proceedings of the Sixth Annual IEEE International Conference on Pervasive Computing and Communications (PERCOM), Retrieved at «http://www.cs.rutgers.edu/discolab/smartphone/papers/percom08.pdf», 2008, 10 Pages.
Richard,"Google's Prediction API Could Optimize Your Car's Fuel Efficiency", Retrieved from <http://www.treehugger.com/cars/googles-prediction-api-could-optimize-your-cars-fuel-efficiency.html> on Nov. 11, 2014, May 18, 2011, 3 pages.
Rong,"An Analytical Model for Predicting the Remaining Battery Capacity Prediction for Lithium-Ion Batteries", In Proceedings of the conference on Design, Automation and Test in Europe—vol. 1, Mar. 2003, 2 pages.
Ross,"A Systematic Approach to Learning Object Segmentation from Motion", MIT Computer Science and Al Laboratory, Retrieved from <<http://web.mit.edu/mgross/www/publications/mgrIpk-cvw-paper-03.pdf>> on Jun. 19, 2009, 8 pages.
Roth,"Fields of Experts: A Framework for Learning Image Priors", IEEE, Retrieved from <<http://ieeexplore.ieee.org/stamp/stamp.jsp?tp=&isnumber=314 73&arnumber=1467533>> on Jun. 19, 2009, 2005, 8 pages.
Roy,"Energy Management in Mobile Devices with Cinder Operating System", In Proceedings of the sixth conference on Computer systems, Oct. 4, 2011, pp. 139-152.
Sachenbacher,"Modeling and Optimization for Efficient Electrical Mobility: Challenges from the E-Tour Project", In Proceedings of First International Workshop on Constraint Reasoning and Optimization for Computational Sustainability, Sep. 20, 2009, 2 pages.
Sathiyanarayanan,"Maximization Battery Lifetime and Improving Efficiency", In Proceedings of International Conference on Devices, Circuits and Systems, Mar. 15, 2012, 4 pages.
Shanklin,"Samsung Gear Live vs. Gear 2", Available at: http://www.gizmag.com/samsung-gear-live-vs-gear-2-smartwatch-comparison/32775/, Jul. 1, 2014, 17 pages.
Shotton,"TextonBoost for Image Understanding: Multi-Class Object Recognition and Segmentation by Jointly Modeling Texture, Layout, and Context", Retrieved from <<http://johnwinn.org/Publications/papers/TextonBoost_IJCV2009.pdf>> on Jun. 19, 2009, Jul. 2, 2007, 30 pages.
Shotton,"Semantic Texton Forests for Image Categorization and Segmentation", IEEE, Retrieved from <<http://ieeexplore.ieee.org/stamp/stamp.jsp?tp=&arnumber=4587503&isnumber=4587335>> on Jun. 19, 2009, 2008, 8 pages.
Shye,"Into the wild: Studying real user activity patterns to guide power optimizations for mobile architectures", In Proceedings of 42nd Annual IEEE/ACM International Symposium on Microarchitecture Dec. 12, 2009, pp. 168-178.
Simpson,"Characteristics of Rechargeable Batteries", In Literature No. SNVA533, 2011, 12 pages.
Smolensky,"Information Processing in Dynamical Systems: Foundations of Harmony Theory", CU-CS-321-86, University of Colorado at Boulder, Department of Computer Science, Retrieved from, Feb. 1986, 55 pages.
Srinivasan,"This week in batteries (TWiB)", Available at: http://thisweekinbatteries.blogspot.in/2010_06_01_archive.html, Jun. 28, 2015, 4 pages.
Strommer,"NFC-enabled Wireless Charging", In Proceedings of the 4th International Workshop on Near Field Communication, Mar. 13, 2012, 6 pages.
Styler,"Active Management of a Heterogeneous Energy Store for Electric Vehicles", In IEEE Forum on Integrated and Sustainable Transportation System, Jun. 29, 2011, 6 pages.
Styler,"Active Management of a Heterogeneous Energy Store for Electric Vehicles", Retrieved from: <http://repository.cmu.edu/cgi/viewcontent.cgi?article=1845&context=robotics> on Jun. 29, 2011, 8 Pages.
Thiagarajan,"Who Killed My Battery: Analyzing Mobile Browser Energy Consumption", In Proceedings of the 21st international conference on World Wide Web, Apr. 16, 2012, pp. 41-50.
Tieleman,"Training Restricted Boltzmann Machines Using Approximations to the Likelihood Gradient", Proceedings of the 25th International Conference on Machine Learning, pp. 1064-1071, 2008, 8 pages.
Tu,"Image Segmentation by Data-Driven Markov Chain Monte Carlo", IEEE Transactions on Pattern Analysis and Machine Intelligence, vol. 24, No. 5, pp. 657-673, May 2002, 17 pages.
Tu,"Image Parsing: Unifying Segmentation, Detection, and Recognition", Proceedings of the Ninth IEEE International Conference on Computer Vision (ICCV 2003) 2-Volume Set, 2003, 8 pages.

(56) References Cited

OTHER PUBLICATIONS

Viswanathan,"Effect of Entropy Change of Lithium Intercalation on Cathodes and Anodes on Li-ion Battery Thermal Management", In Journal of Power Sources, vol. 195, Issue 11, Jun. 1, 2010, pp. 3720-3729.

Wagner,"Microsoft Planning 7-Day Phone Batteries", Retrieved from <http://www.lightreading.com/mobile/devices-smartphones/microsoft-planning-7-day-phone-batteries/d/d-id/709382> on Nov. 11, 2014, Jun. 10, 2014, 4 pages.

Wang,"Reducing Power Consumption for Mobile Platforms via Adaptive Traffic Coalescing", In IEEE Journal on Selected Areas in Communications, vol. 29, Issue 8, Sep. 2011, pp. 1618-1629.

Wen,"Online prediction of Battery Lifetime for Embedded and Mobile Devices", In Proceedings of the Third International Conference on Power—Aware Computer Systems, Dec. 1, 2003, 15 pages.

Wu,"An Interleaved Dual-Battery Power Supply for Battery-Operated Electronics", In Proceedings of the Asia and South Pacific Design Automation Conference, Jan. 28, 2001, pp. 387-390.

Xu,"V-edge: Fast Self-constructive Power Modeling of Smartphones Based on Battery Voltage Dynamics", In Proceedings of the 10th USENIX conference on Networked Systems Design and Implementation, Apr. 2, 2013, 24 pages.

Xu,"Optimizing Background Email Sync on Smartphones", In Proceeding of the 11th Annual International Conference on Mobile Systems, Applications, and Services, Jun. 25, 2013, pp. 55-68.

Yoon,"App-Scope: Application Energy Metering Framework for Android Smartphones using Kernel Activity Monitoring", In Proceedings of the USENIX conference on Annual Technical Conference, Jun. 15, 2012, 14 pages.

Zeng,"ECOSystem: Managing Energy as a First Class Operating System Resource", In Proceedings of ASPLOS 2002, Available at <http://www.cs.duke.edu/~vandat/ps/ecosystem.pdf>, Oct. 2002, 10 pages.

Zhang,"Abstract—Cooperation Behavior between Heterogeneous Cations in Hybrid Batteries", In Journal of Chemical Communications, Issue 85, Aug. 22, 2013, 4 pages.

Zhang,"Accurate Online Power Estimation and Automatic Battery Behavior Based Power Model Generation for Smartphones", In Proceedings of the eighth IEEE/ACM/IFIP international conference on Hardware/software codesign and system synthesis, Oct. 24, 2010,, Oct. 24, 2010, pp. 105-114.

Zhang,"Modeling Discharge Behavior of Multicell Battery", In Proceeding of the IEEE Transactions on Energy Conversion, vol. 25, Issue 4, Dec. 2010, pp. 1133-1141.

Zheng,"Enhancing Battery Efficiency for Pervasive Health-Monitoring Systems Based on Electronic Textiles", In Proceedings of IEEE Transactions on Information Technology in Biomedicine, vol. 14, No. 2, Nov. 3, 2009, 10 pages.

Zhu,"A Stochastic Grammar of Images", Foundations and Trends in Computer Graphics and Vision, vol. 2, No. 4, pp. 259-362, 2006, 104 pages.

"Corrected Notice of Allowance", U.S. Appl. No. 14/941,416, dated Mar. 8, 2018, 2 pages.

"Corrected Notice of Allowance", U.S. Appl. No. 14/941,416, dated Dec. 26, 2017, 2 pages.

"Final Office Action", U.S. Appl. No. 14/617,751, dated Feb. 5, 2018, 11 pages.

"Final Office Action", U.S. Appl. No. 14/617,751, dated Feb. 13, 2018, 14 pages.

"Final Office Action", U.S. Appl. No. 14/617,751, dated Mar. 7, 2018, 12 pages.

"Final Office Action", U.S. Appl. No. 14/626,518, dated Jan. 11, 2018, 37 pages.

"Final Office Action", U.S. Appl. No. 14/662,938, dated Feb. 21, 2018, 44 pages.

"Final Office Action", U.S. Appl. No. 14/624,808, dated Dec. 29, 2017, 6 pages.

"Corrected Notice of Allowance", U.S. Appl. No. 14/633,009, dated Jul. 28, 2017, 2 pages.

"Non-Final Office Action", U.S. Appl. No. 14/662,938, dated Aug. 9, 2017, 33 pages.

"International Preliminary Report on Patentability", Application No. PCT/US2016/016034, dated Aug. 4, 2017, 9 pages.

"Altium Designer", Retrieved from: https://web.archive.org/web/20060618084652/http://www.altium.com:80/Evaluate/DemoCenter/, Jun. 18, 2006, 1 Page.

Wang, et al., "Energy storage in datacenters: what, where, and how much?", In Proceedings of the 12th ACM Sigmetrics/Performance joint international conference on Measurement and Modeling of Computer Systems, 2012, pp. 187-198.

"Cortana Personal Assistant", Retrieved from: https://support.microsoft.com/en-us/help/11694/windows-phone-cortana-on-your-windows-phone, Jul. 28, 2017, 1 Page.

Wang, et al., "A Framework for Energy Efficient Mobile Sensing for Automatic Human State Recognition", In roceedings of the 7th International Conference on Mobile Systems, Applications, and Services, Jun. 22-25, 2009, pp. 179-192.

"External Battery Packs", Retrieved from: https://web.archive.org/web/20130104202022/http://www.ianker.com/External%20Batteries/category-c1-s1, Jan. 4, 2013, 1 Page.

"Final Office Action Issued in U.S. Appl. No. 14/626,518", dated Sep. 7, 2018, 33 Pages.

Govindan, et al., "Benefits and Limitations of Tapping into Stored Energy for Datacenters", In Proceedings of the 38th annual international symposium on Computer architecture, ISCA '11, Jun. 4, 2011, 11 Pages.

Badam, et al., "Software Defined Batteries", In the Symposium on Operating Systems Principles, Oct. 4, 2015, pp. 215-229.

"Samsung Galaxy Gear Specs", Retrieved from: https://web.archive.org/web/20131115110653/http://www.samsung. com/us/mobile/wearable-tech/SM-V7000ZKAXAR, Nov. 15, 2013, 4.

"Texas Instruments Fuel Guages for Mobile Devices", Retrieved from: http://www.ti.com/power-management/battery-management/fuel-gauge/products.html#p1152=Single%20Cell&p338=Li-Ion/Li-Polymer&p199=I2C&o4=Active&p626max=2000;29000&p626min=100;100&p1960=&p2192=&p2954=DSBGA, Retrieved on: Jun. 7, 2018, 2 pages.

"Notice of Allowance Issued in U.S. Appl. No. 14/624,808", dated Sep. 12, 2018, 8 Pages.

"Non-final Office Action Issued in U.S. Appl. No. 14/626,518", dated Apr. 19, 2018, 41 Pages.

"Non Final Office Action Issued in U.S. Appl. No. 14/885,858", dated Sep. 10, 2018, 23 Pages.

"Notice of Allowance Issued in U.S. Appl. No. 15/650,666", dated Sep. 11, 2018, 9 Pages.

"Office Action Issued in European Patent Application No. 16705002.0", dated Aug. 15, 2018, 5 Pages.

"Office Action Issued in European Patent Application No. 16704985.7", dated Jun. 18, 2018, 5 Pages.

"Office Action Issued in European Patent Application No. 16705392.5", dated Jul. 11, 2018, 5 Pages.

"Notice of Allowance Issued in Europe Patent Application No. 16706075.5", dated Jul. 25, 2018, 5 Pages.

"Intent to Grant Issued in European Patent Application No. 16706100.1", dated Jun. 25, 2018, 8 Pages.

European Application Serial No. 16707584.5, Office Action dated Nov. 23, 2018, 6 Pages.

* cited by examiner

BATTERY PARAMETER-BASED POWER MANAGEMENT FOR SUPPRESSING POWER SPIKES

RELATED APPLICATIONS

This application is a continuation of and claims priority to U.S. application Ser. No. 14/617,719, filed Feb. 9, 2015, entitled "Battery Parameter-Based Power Management for Suppressing Power Spikes" the disclosure of which is incorporated by reference herein in their entirety.

BACKGROUND

This background is provided for the purpose of generally presenting a context for the instant disclosure. Unless otherwise indicated herein, material described in the background is neither expressly nor impliedly admitted to be prior art to the instant disclosure or the claims that follow.

Batteries are often used as a power source for mobile computing and electronic devices. Typically, a run-time of the mobile device is determined by the device's batteries' ability to provide power. This power is drawn from the batteries until the batteries are unable to support operations of the mobile device. A battery's ability to provide power, however, may be dependent on ways in which power is drawn from the battery.

For example, spikes in power consumed from a battery at low capacity may cause a voltage of the battery to drop substantially. Because some device-data protection thresholds are based on battery voltage, this substantial drop in voltage can trigger premature shutdown of the device. Additionally, although the battery is already at low capacity, the battery may still contain useful power that is not utilized as a result of the premature shutdown. As such, spikes in power consumption may impact a user's ability to use the device and preclude complete utilization of a battery's useful power.

SUMMARY

This document describes techniques and apparatuses for suppressing power spikes. In at least some cases, suppressing spikes of power consumed by a device can prevent a voltage of the device's battery from encountering a shutdown threshold. By so doing, more energy may be extracted from the battery thereby enabling the device to run for longer durations of time. In some embodiments, an available amount of power that a battery is capable of providing while maintaining a prescribed voltage level is determined. A requisite amount of power that will be consumed by components to execute multiple tasks is also determined. When the requisite amount of power exceeds the available amount of power, execution of one or more of the multiple tasks can be rescheduled to reduce the amount of power which will be consumed and thereby enable the battery to maintain the prescribed voltage level. In other embodiments, a request to perform a task having a particular priority level is received. A requisite amount of power that resources will consume to perform the task and other tasks is then determined. In response to determining the requisite amount of power will exceed an available amount of power that a battery is capable of providing, resources involved with performing the other tasks having lower priority levels are identified. Power states of these identified resources are then altered such that the requisite power does not exceed the available amount of power. In these or other embodiments, altering power states of components or resources may also be sequenced effective to reduce amounts of power consumed over short durations of time.

This summary is provided to introduce simplified concepts that are further described below in the Detailed Description. This summary is not intended to identify essential features of the claimed subject matter, nor is it intended for use in determining the scope of the claimed subject matter. Techniques and/or apparatuses for suppressing power spikes are also referred to herein separately or in conjunction as the "techniques" as permitted by the context, though techniques may include or instead represent other aspects described herein.

BRIEF DESCRIPTION OF THE DRAWINGS

Embodiments enabling suppression of power spikes are described with reference to the following drawings. The same numbers are used throughout the drawings to reference like features and components.

DETAILED DESCRIPTION

Overview

In some situations, intensive or concurrent operations of a device cause spikes in power consumption that exceed an amount of power that the device's battery can provide. Typically, when the battery's state-of-charge is low, these power spikes cause a voltage level of the battery to drop until a protection threshold is encountered, at which point the device shuts down. For example, a system powered by the battery can be designed conservatively to protect a battery. In some cases, the system is designed such that the voltage level of the battery is not permitted to drop below a protection threshold. To achieve this, the system can be forced into shutdown, even though usable charge remains in the battery. While the forced shutdown may prevent power spikes from causing the voltage to cross the threshold, the remaining charge of the battery is rendered unusable.

This document describes techniques and apparatuses that enable suppression of power spikes. In at least some embodiments, monitoring a battery's available power and estimating power that components will consume enables the timing of potential power spikes to be determined. Further, altering respective power states of the components at the determined times can mitigate these potential power spikes effective to avoid device shutdown. By so doing, more useful energy can be extracted from the device's battery, which in turn enables longer device run-times. This is but one example of many in which the techniques suppress power spikes, others of which are described below.

Example Operating Environment

Figure 1:
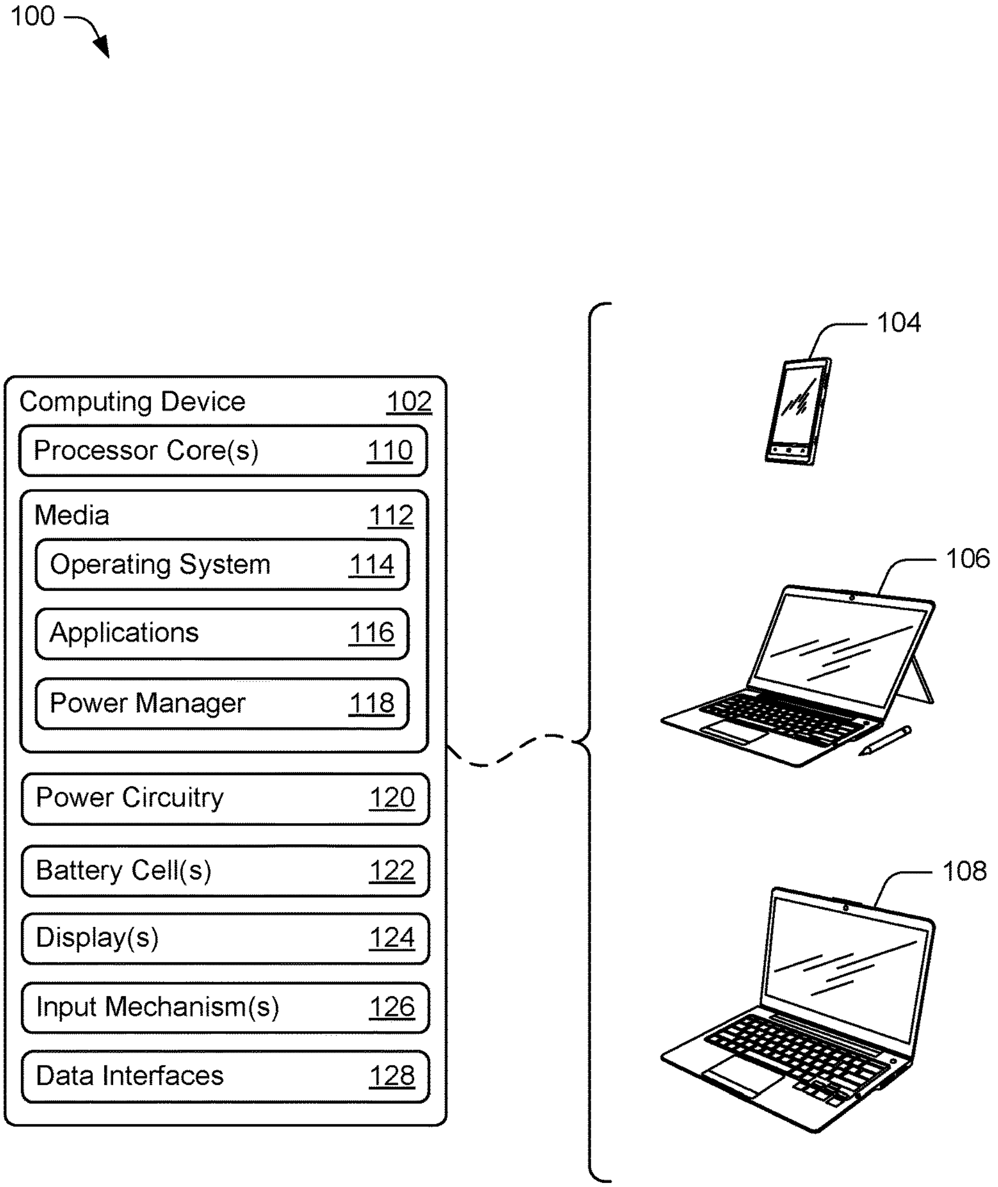
FIG. 1 illustrates an example environment in which techniques for suppressing power spikes can be implemented.

FIG. 1 illustrates an example operating environment 100 in which techniques for suppressing power spikes can be embodied. Operating environment 100 includes a computing device 102, which is illustrated with three examples: a smart phone 104, a tablet computing device 106 (with optional keyboard), and a laptop computer 108, though other computing devices and systems, such as netbooks, smart watches, fitness accessories, electric vehicles, Internet-of-Things (IoT) devices, wearable computing devices, media players, and personal navigation devices may also be used.

Computing device 102 includes processor cores(s) 110 and computer-readable storage media 112 (media 112). Processor cores 110 may include any suitable number of cores that are configured similarly or differently, such as cores configured as computer processing units (CPUs) or graphical processing unit (GPUs). In some cases, processor cores 110 may operate independently from each other, at different respective clock speeds, or at different respective power states.

Media 112 may be configured as volatile memory media (e.g., random access memory) or non-volatile storage media (e.g., Flash memory) and includes an operating system 114 and applications 116, which enable various operations of computing device 102. Operating system 114 manages components and resources of computing device 102, such as processor cores 110, media 112, and the like (e.g., hardware subsystems). Applications 116 comprise tasks or threads that access the resources managed by operating system 114 to implement various operations of computing device 102. Media 112 also includes power manager 118, the implementation and use of which varies and is described in greater detail below.

Computing device 102 also includes power circuitry 120 and battery cell(s) 122, from which computing device 102 can draw power to operate. Generally, power circuitry 120 may include firmware or hardware configured to enable computing device 102 to draw operating power from battery cells 122 or to apply charging power to battery cells 122. Battery cells 122 may include any suitable number or type of rechargeable battery cells, such as lithium-ion (Li-on), lithium-polymer (Li-Poly), lithium ceramic (Li-C), and the like. Implementations and uses of power circuitry 120 and battery cells 122 vary and are described in greater detail below.

Computing device 102 may also include display 124, input mechanisms 126, and data interfaces 128, which may also be referred to as components or resources of computing device 102. Although shown integrated with the example devices of FIG. 1, display 124 may be implemented separate from computing device 102 via a wired or wireless display interface. Input mechanisms 126 may include gesture-sensitive sensors and devices, such as touch-based sensors and movement-tracking sensors (e.g., camera-based), buttons, touch pads, accelerometers, and microphones with accompanying voice recognition software, to name a few. In some cases, input mechanisms 126 are integrated with display 124, such an in a touch-sensitive display with integrated touch-sensitive or motion-sensitive sensors.

Data interfaces 128 include any suitable wired or wireless data interfaces that enable computing device 102 to communicate data with other devices or networks. Wired data interfaces may include serial or parallel communication interfaces, such as a universal serial bus (USB) and local-area-network (LAN). Wireless data interfaces may include transceivers or modules configured to communicate via infrastructure or peer-to-peer networks. One or more of these wireless data interfaces may be configured to communicate via near-field communication (NFC), a personal-area-network (PAN), a wireless local-area-network (WLAN), or wireless wide-area-network (WWAN). In some cases, operating system 114 or a communication manager (not shown) of computing device 102 selects a data interface for communications based on characteristics of an environment in which computing device 102 operates.

Figure 2:
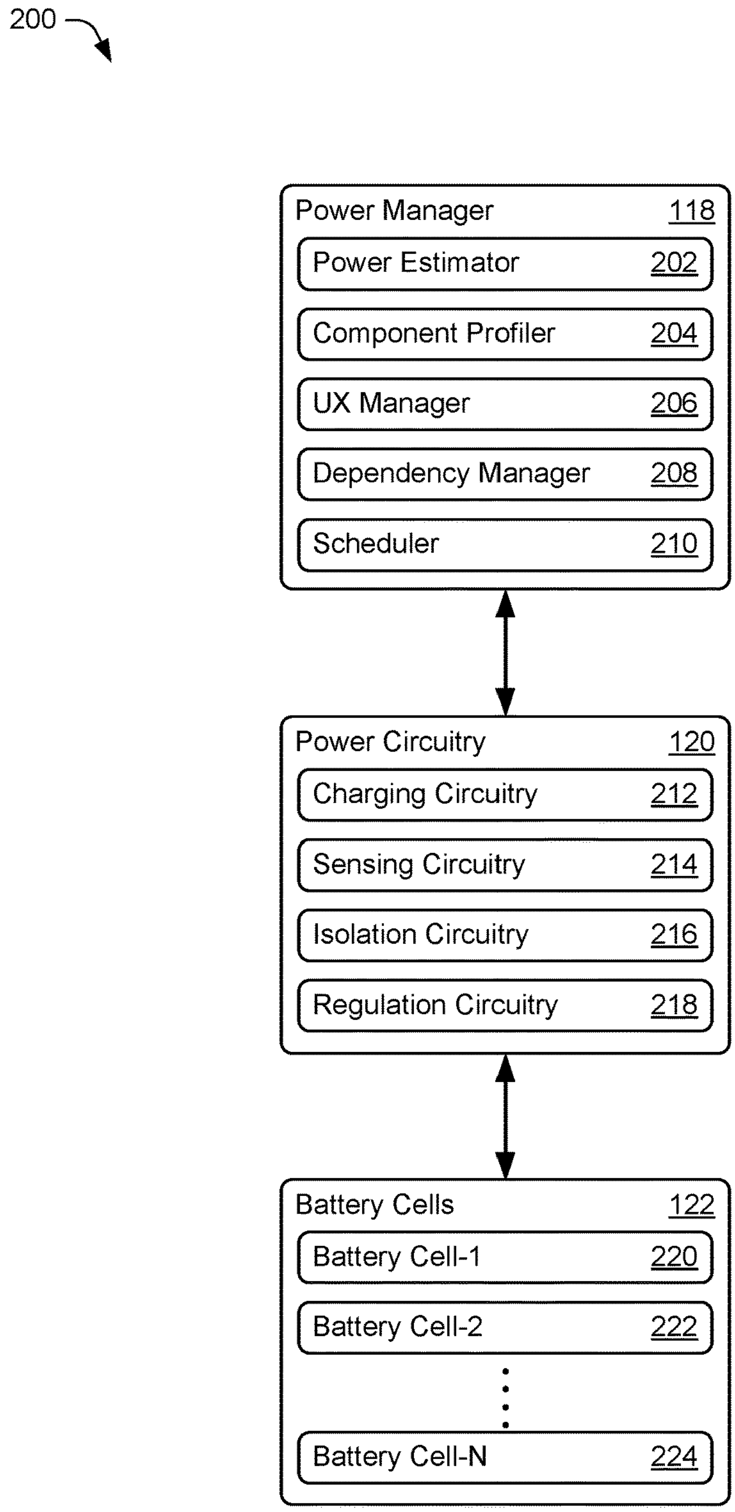
FIG. 2 illustrates an example power system capable of implementing suppression of power spikes.

FIG. 2 illustrates an example power system 200 capable of implementing aspects of the techniques described herein. In this particular example, power system 200 includes power manager 118, power circuitry 120, and battery cells 122. In some embodiments, power manager 118 is implemented in software (e.g. application programming interface) or firmware of a computing device by a processor executing processor-executable instructions. Alternately or additionally, components of power manager 118 can be implemented integral with other components of power system 200, such as power circuitry 120 and battery cells 122 (individual or packaged).

Power manager 118 may include any or all of the entities shown in FIG. 2, which include power estimator 202, component profiler 204, user experience manager 206, resource dependency manager 208, and power state scheduler 210 (scheduler 210). Power estimator 202 is configured to estimate an amount of power that a battery or battery cell can provide for computing device 102 to operation.

This amount of power (e.g., available power) may be an amount that the battery can provide without a voltage of the battery encountering a shutoff threshold, such as a soft cutoff enforced by software or a hard cutoff enforced by hardware. When voltage of the battery encounters or goes below the soft cutoff voltage level, operating system 114 may shutdown computing device 102 in an attempt to preserve data. When the voltage of the battery encounters or goes below the hard cutoff voltage level, safety circuitry of the battery disconnects the battery, which can result in the loss of any unsaved data.

Power estimator 202 may monitor or determine characteristics of battery cells 122, such as voltage, open circuit potential, state-of-charge, current flow, internal resistance, temperature, age (e.g., time or charging cycles), and the like. Power estimator 202 may also determine or have access to respective configuration information for battery cells 122, such as cell manufacturer, chemistry type, rated capacity, voltage and current limits (e.g., cutoffs), and the like. Power estimator 202 may store and enable other entities of power manager 118 to access this battery cell configuration information.

Power estimator 202 may estimate the amount of power that a battery can provide based on the battery's open circuit potential ($V_{OCP}$), internal resistance ($R_{Internal}$), and workload. From the battery's state-of-charge (SoC), which is an estimate of how much energy is left in the battery, $V_{OCP}$ can be determined by known or profiled non-linear relationships between SoC and $V_{OCP}$. In some cases, power estimator may retrieve the battery's SoC from a run-time coulomb counter of a power management integrated-circuit (PMIC) of the battery. In such cases, the PMIC may store $V_{OCP}$ values for the battery's SoC at increments of single percentage points of SoC. Alternately or additionally, the PMIC can store values of the battery's internal resistance, which usually varies inversely with SoC and may be stored at the time of battery manufacture.

Power estimator 202 may calculate or abstract the battery's workload as a set of power curves (not shown), which includes respective power draw curves for components or resources of computing device 102. From these power curves, workload values for load current ($I_{Load}$), which is an amount of current required by the system, can be used to determine load voltage ($V_{Load}$) as shown in Equation 1.

$$V_{Load}=V_{OCP}-I_{Load}*R_{Internal} \quad \text{Equation 1}$$

An amount of power that the battery can provide, or power capacity ($P_{Capacity}$) can be found and maximized for values of $V_{Load}$ as shown in Equation 2.

$$P_{Capacity}=\max\left(\frac{(V_{OCP}-V_{Load})*V_{Load}}{R_{Internal}}\right) \quad \text{Equation 2}$$

In some cases, $P_{Capacity}$ is maximized for the value of $V_{Load}$ that is closest to $V_{OCP}/2$ but above a hard cutoff voltage level for the battery. By ensuring that $I_{Load}*V_{Load}$ is less than $P_{Capacity}$, power manager 118 may ensure that computing device 102 does not prematurely shutdown due to power spikes and that a maximum amount of energy can be extracted from battery cells 122.

Component profiler 204 is configured to determine or store power profiles for the resources of computing device 102. The power profiles may include information that indicates measured or estimated amounts of power that a component will draw under varying respective workloads. In some cases, component profiler 204 profiles power draw of the resources at various respective power states. In other cases, power profiles for the resources are calculated or determined offline (e.g., experimental results) and stored by component profiler 204.

In some embodiments, power profiles are determined for a number of resources or components. For example, a computing device having n number of components C may be represented as shown in Equation 3.

$$C_n \in C=\{CPU1, CPU2, WiFi, Cellular, Dispaly, Storage\} \quad \text{Equation 3}$$

Further, for each component C may have k power states $S_k$ at which performance and power consumption of the component varies. For example, power states for a processor core (CPU-1) may be represented as shown in Equation 4, where clock frequencies correspond with each power state k of the processor core.

$$S_k \in S=\{0\text{ MHz}, 200\text{ MHz}, 500\text{ MHz}, 800\text{ MHz}, 1\text{ GHz}\} \quad \text{Equation 4}$$

Extending the above concept to other components of a computing device, power profiles that indicate an amount of power that each component n at power state k consumes may be defined as $P_{n,k}$. Component Profiler 204 can determine or store the power profiles for components of computing device 102 in any suitable format, such as those values shown in Table 1. Here, note that some of the example components' $S_1$ power state consumptions may be very low or close-to-zero.

TABLE 1

| Component Power Profiles | | | | | | |
|---|---|---|---|---|---|---|
| | | Power States | | | | |
| | | $S_1$ | $S_2$ | $S_3$ | $S_4$ | $S_5$ |
| Component | CPU-1 | <0.1 W | 0.4 W | 1.0 W | 1.6 W | 2.0 W |
| | CPU-2 | <0.1 W | 0.4 W | 1.0 W | 1.6 W | 2.0 W |
| | Wifi | <0.1 W | 0.8 W | 2.5 W | — | — |
| | Cellular | <0.1 W | 0.4 W | 0.8 W | 4.5 W | — |
| | Display | <0.1 W | 0.6 W | 0.7 W | 0.8 W | 0.9 W |
| | Storage Media | <0.1 W | 0.4 W | 2.1 W | — | — |

UX manager 206 is configured to manage a user experience associated with computing device 102, such as perceived service completion time or service quality of tasks performed. In the context of task performance, shorter completion times (e.g., less delay, quicker response) often correlate to a more-positive experience from the perspective of the user. Task completion time t of a given task to be performed by a component $C_n$ at power state $S_k$ may be defined as shown in Equation 5.

$$t_{n,k}=f_n(k) \quad \text{Equation 5}$$

Completion times for tasks may then be expressed as $\max(t_{n,k})$, from which UX manager 206 may determine task processing times for various components at multiple respective power states, which are shown in Table 2.

TABLE 2

| Normalized Completion Times (seconds) | | | | | | |
|---|---|---|---|---|---|---|
| | | Power States | | | | |
| | | $S_1$ | $S_2$ | $S_3$ | $S_4$ | $S_5$ |
| Component | Core-1 | +∞ | 5.00 s | 2.00 s | 1.25 s | 1.00 s |
| | Core-2 | +∞ | 5.00 s | 2.00 s | 1.25 s | 1.00 s |
| | Wifi | +∞ | 5.00 s | 1.00 s | — | — |
| | Cellular | +∞ | 8.00 s | 2.00 s | 1.00 s | — |
| | Display | — | — | — | — | — |
| | Storage Media | +∞ | 2.00 s | 1.00 s | — | — |

Alternately or additionally, UX manager 206 may a quantify a level or quality of service provided by computing device 102, such as audio or video quality provided in association with performance of a task. Service quality may also be a function of component power states, such as providing higher levels of service or quality when components are at higher power states. Service quality q of a given task to be performed by a component $C_n$ at power state $S_k$ may be defined as shown in Equation 6.

$$q_{n,k}=q_n(k) \quad \text{Equation 6}$$

In some embodiments, overall experience is defined as a summation of individual component q as illustrated by Equation 7, in which $w_n$ is a weighting factor for respective components.

$$Q_{n,k}=\sum w_n * q_n(k) \quad \text{Equation 7}$$

Each component may have a different weighting factor based on an extent to which performance of the component effects user experience, perceived, feedback-based, predicted, and the like. For example, reducing screen brightness (e.g., lower power state) may be weighted more-heavily than reducing processor core frequency or voltage, which may not be as noticeable to the user. Based on Equations 5 and 7, a general user experience metric E for UX manager 206 may be defined as shown in Equation 8, where α and β are weights for service completion time and quality, respectively.

$$E=\alpha*\max(t_{n,k})+\beta*Q_{n,k} \quad \text{Equation 8}$$

Dependency manager 208 determines or manages various component constraints, such as cross-component dependencies or minimum power states constraints. In some cases, such as when performing tasks that rely on multiple components, some of the multiple components' power states may have minimum power states at which performance of the task is enabled. For example, when communicating data via a WiFi or cellular connection, a processor core may need to operate at minimum power state (e.g., power state s2) to facilitate communication of the data. Alternately or additionally, a WiFi or cellular interface may need to maintain a particular power state in order to prevent a wireless communication link from dropping or disconnecting.

In some embodiments, dependency manager 208 may determine these minimum power states or component dependencies in terms that are similar to those described above. For example, a minimum power state $S_k$ maintained by a given component $C_n$ to perform a task may be determined based on application conditions $A_m$. Alternately or additionally, cross-component power constraints may be determined for a given component $C_n$ based on power state $S_j$ of another component $C_j$, such that power states of component $C_n$ are limited to a subset of its respective power states. A unified notation of these terms may be expressed as shown below in Equation 9, in which $A_m$ is a particular application scenario and $S_j$ is the power state of another component that may affect $C_k$ if $S_j \in S^*$.

$$S_k \in S' \subset S \text{ if } \exists A_m \text{ or } S_j \in S^* \quad \text{Equation 9}$$

Scheduler 210 manages or alters power states of the resources or components of computing device 102. In some cases, scheduler 210 alters respective power states of the components to reduce an amount of power consumed by the components at a particular point or over a short duration of time. In some cases, scheduler 210 is configured to suppress power spikes associated with the components' consumption of power, which may prevent premature shutdown of computing device 102. In such cases, scheduler 210 or other components of power manager 118 may be configured to minimize any effects that altering power states of the components may have on user experience.

In the context of Equations 1 through 9, scheduler 210 may be implemented to optimize performance of computing device 102 under power limitation $P_l$ as shown in Equation 10.

$$\max_{n,k} E = \alpha*\max(t_{n,k}) + \beta*Q_{n,k} \quad \text{Equation 10}$$

Subject to:

$$\sum P_{n,k} < P_l,\ S_k \in S' \subset S \text{ if } \exists A_m \text{ or } S_j \in S^*$$

In some cases, scheduler 210 may operate when $\Sigma P_{n,k} < P_l$ effective to prevent the requisite power consumed by the resources from exceeding the power that a battery can provide for the device to operate (e.g., available amount of power). By so doing, computing device 102 may continue to operate and extract more useful energy from the battery. This can be particularly effective when the battery's state of charge is less than 10% to 15%, when increased current draw can cause adverse drops in the battery's voltage. Further implementations and use of scheduler 210 vary and are described in greater detail below.

Although shown as disparate entities, any or all of power estimator 202, component profiler 204, UX manager 206, dependency manager 208, and scheduler 210 may be implemented separate from each other or combined or integrated in any suitable form. For example, any of these entities, or functions thereof, may be combined generally as power manager 118, which can be implemented as a program application interface (API) or system component of operating system 114.

Power system 200 also includes power circuitry 120, which provides an interface between power manager 118, components of computing device 102, and/or battery cells 122. Generally, power circuitry 120 may include hardware and firmware that enables computing device 102 to draw power from (e.g., discharge), apply power to (e.g., charge) battery cells 122, and implement various embodiments thereof. In this particular example, power circuitry 120 includes charging circuitry 212, sensing circuitry 214, isolation circuitry 216, and voltage regulation circuitry 218 (regulation circuitry 218).

Power circuitry 120 is configured to provide current by which battery cells 122 are charged. Charging circuitry may implement any suitable charging profile such as constant current, constant voltage, custom profiles provided by power manager 118, and the like. In at least some embodiments, charging circuitry 212 is capable of providing different amounts of current to different respective battery cells being charged concurrently.

Sensing circuitry 214 is configured to sense or monitor operational characteristics of battery cells 122. These operational characteristics may include a voltage level, state-of-charge, an amount of current applied to, or an amount of current drawn from a respective one of battery cells 122. In some cases, sensing circuitry 214 may be implemented integral with power circuitry 120, such as part of a charging controller (e.g., PMIC) or circuit that includes sensing elements (e.g., analog-to-digital converters (ADCs) and sense resistors).

Power circuitry 120 also includes isolation circuitry 216, which enables power manager 118 to isolate single or subsets of battery cells 122. While isolated, single battery cells or subsets of battery cells may be charged or discharged concurrently. For example, charging current can be applied to a battery cell isolated by isolation circuitry 216 while computing device 102 draws operating power from all or a subset of the remaining battery cells. In some cases, isolation circuitry is implemented as multiplexing circuitry that switches between battery cells 122 to facilitate connection with an appropriate set of power circuitry for battery cell sensing, power consumption, or charging.

Regulation circuitry 218 regulates power provided by battery cells 122 to voltages that are suitable for consumption by components of computing device 102. In some cases, regulation circuitry 218 provides, from varying battery voltage, power at one or more relatively constant voltages (e.g., 1.8 V, 3.3 V, or 5 V) to various component or modules of computing device 102. In such cases, regulation circuitry may provide the power while respective voltages of battery cells 122 remain above a cutoff (e.g., protection) threshold.

Battery cells 122 may include any suitable number or type of battery cells. In this particular example, battery cells 122 include battery cell 1 220, battery cell 2 222, and battery cell N 224, where N may be any suitable integer. In some cases, computing device may include a single battery cell 122 to which the techniques described herein can be applied without departing from the spirit of the disclosure. In other cases, battery cells 122 may include various homogeneous or heterogeneous combinations of cell shape, capacity, or chemistry type.

Example types of battery chemistry include lithium-ion (Lion), lithium-polymer (Li-Poly), lithium ceramic (Li-C), flexible printed circuit Li-C (FPC-LiC), and the like. Each of battery cells 122 may have a particular or different cell configuration, such as a chemistry type, shape, capacity, packaging, electrode size or shape, series or parallel cell arrangement, and the like. Accordingly, each of battery cells 122 may also have different parameters, such as internal resistance, capacitance, or concentration resistance.

Example Methods

The methods described herein may be used separately or in combination with each other, in whole or in part. These methods are shown as sets of operations (or acts) performed, such as through one or more entities or modules, and are not necessarily limited to the order shown for performing the operation. In portions of the following discussion, reference may be made to the operating environment 100 of FIG. 1, entities of power system 200 of FIG. 2, and other methods and example embodiments described elsewhere herein, reference to which is made for example only.

Figure 3:
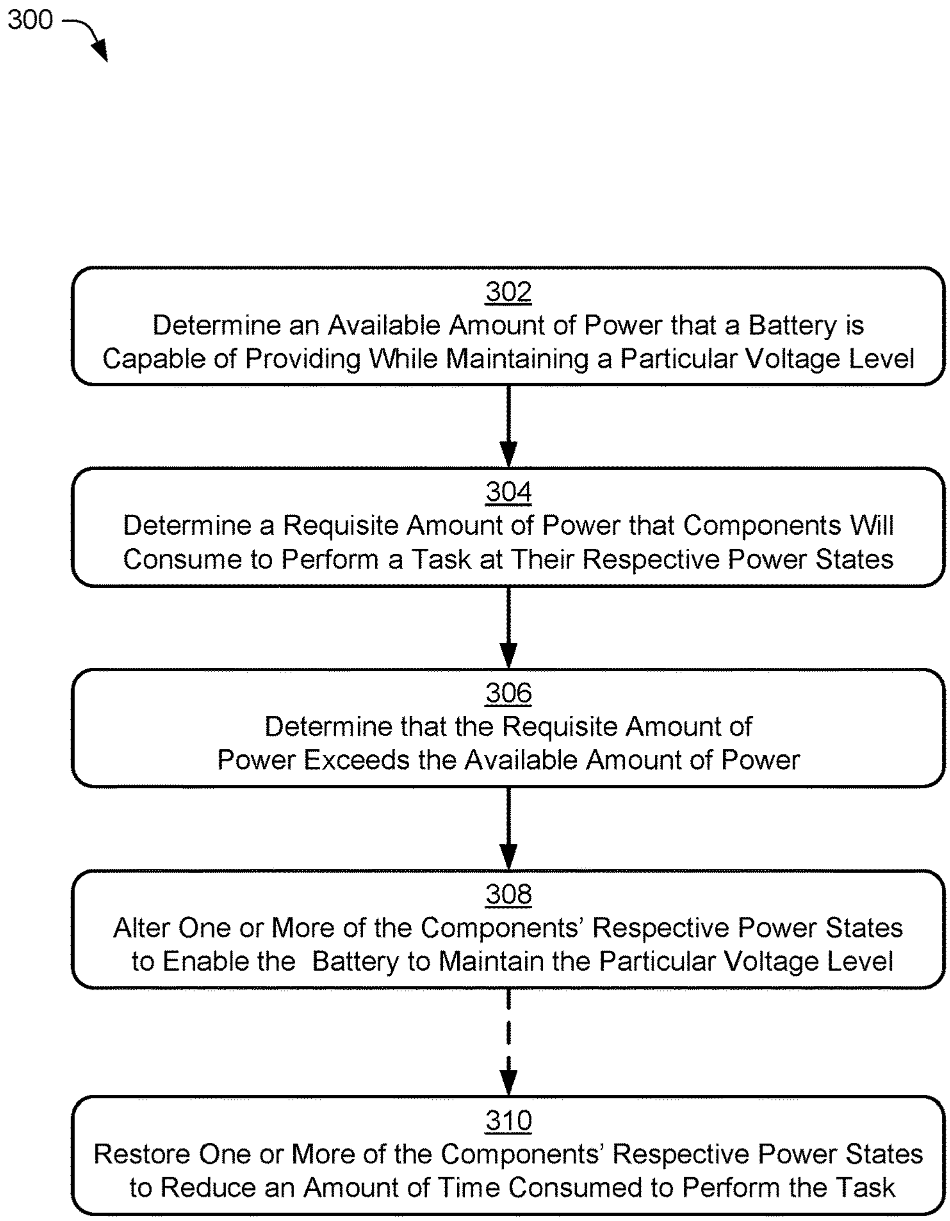
FIG. 3 illustrates an example method for enabling a battery to maintain a particular voltage level.

FIG. 3 depicts method 300 for enabling a battery to maintain a particular voltage level, including operations performed by power manager 118 or scheduler 210.

At 302, an amount of power that a battery of a device can provide is determined. This available amount of power may be an amount of power that the battery can provide while maintaining a particular voltage level. In some cases, the particular voltage level is at or above a cutoff voltage of the battery. The determination of available power may be made for a point in time, period of time, or time slot that is occurring or will occur. For example, available amounts of power may be determined for respective time slots of task execution or performance, such as those of an operating system (OS) scheduler. In some cases, the available amount of power may be estimated or determined based on factors described herein, such as battery SoC, terminal voltage, rated battery capacity, and so on. Accordingly, in such cases, the available amount of power may not be an exact determination, but rather an approximate amount as estimated by a system component (e.g., power estimator 202).

By way of example, consider power system 200 and the components of computing device 102, such as processor cores 110, display 124, and data interfaces 128. Here, assume that power system 200 is implemented in smart phone 104, which is in the process of syncing email over a WiFi connection. Typically, utilization of smart phone 104's components to sync email consumes a relatively low amount of average power.

Figure 4:
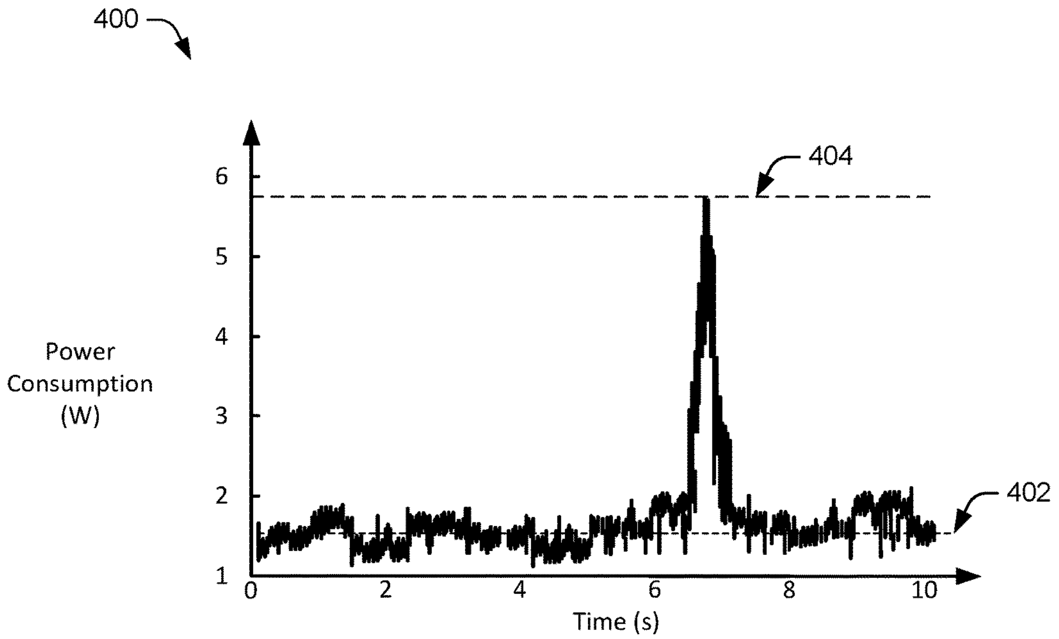
FIG. 4 illustrates examples of unsuppressed power spikes in the context of device power consumption.
Figure 4:
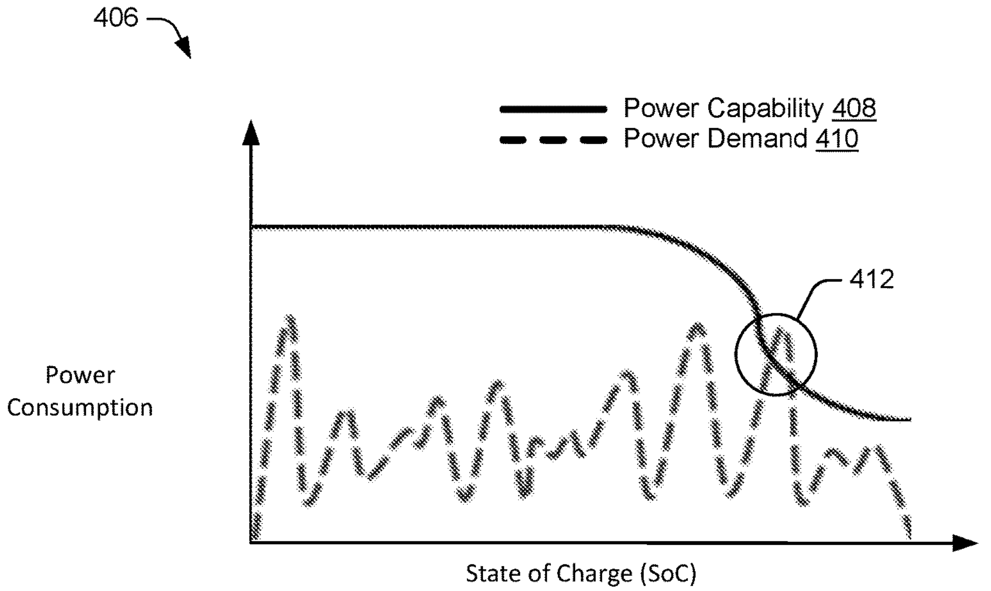

An example of this is illustrated by voltage graph 400 of FIG. 4 in which average power consumption 402 is approximately 1.5 Watts. In the context of operation 302, power estimator 202 determines that battery cell 122 can provide 3.2 Watts of power without encountering its soft cutoff voltage, which is more than the average amount of current of 1.5 Watts consumed when syncing email.

At 304, an amount of power that components of the device will consume is determined. This power may be a requisite amount of power that the components will consume while performing the task at their respective power states. The determination of requisite power may be made for a point in time, period of time, or time slot that is occurring or will occur. For example, requisite amounts of power may be determined for respective time slots of task execution or performance, such as those of an OS scheduler. In some cases, the OS scheduler may be queried to determine which tasks, and therefore which resources or components, are scheduled for utilization.

As noted with respect to an amount of available power, the amount of requisite power may be estimated, or determined based on factors described herein, such as tasks or operations to be performed by the device and components utilized for the execution thereof. Accordingly, in such cases, the amount of requisite power may not be an exact determination, but rather an approximate amount as estimated by a system component (e.g., component profiler 204).

In the ongoing example, component profiler 204 forecasts an amount of power that will be consumed by components of smart phone 104 while syncing email and performing other tasks. Although syncing email typically consumes low amounts of average power, concurrent performance of the other tasks can cause spikes in instantaneous power consumption. An example of this is illustrated by voltage graph 400 of FIG. 4 in which power consumption spikes to peak power consumption 404 when processor cores 110 perform several other background tasks concurrently.

Further, assume that battery cell 122 of smart phone 104 is at a low state-of-charge, such as approximately 12% of capacity. As illustrated by power graph 406, typically, when battery cell 122's power capability 408 (e.g., state-of-charge) is low, a spike to peak power consumption 404 may cause power demand 410 to exceed power capability 408. This is shown at 412, at which point the spike in power consumption may cause smart phone 104 to shutdown unexpectedly.

Figure 5:
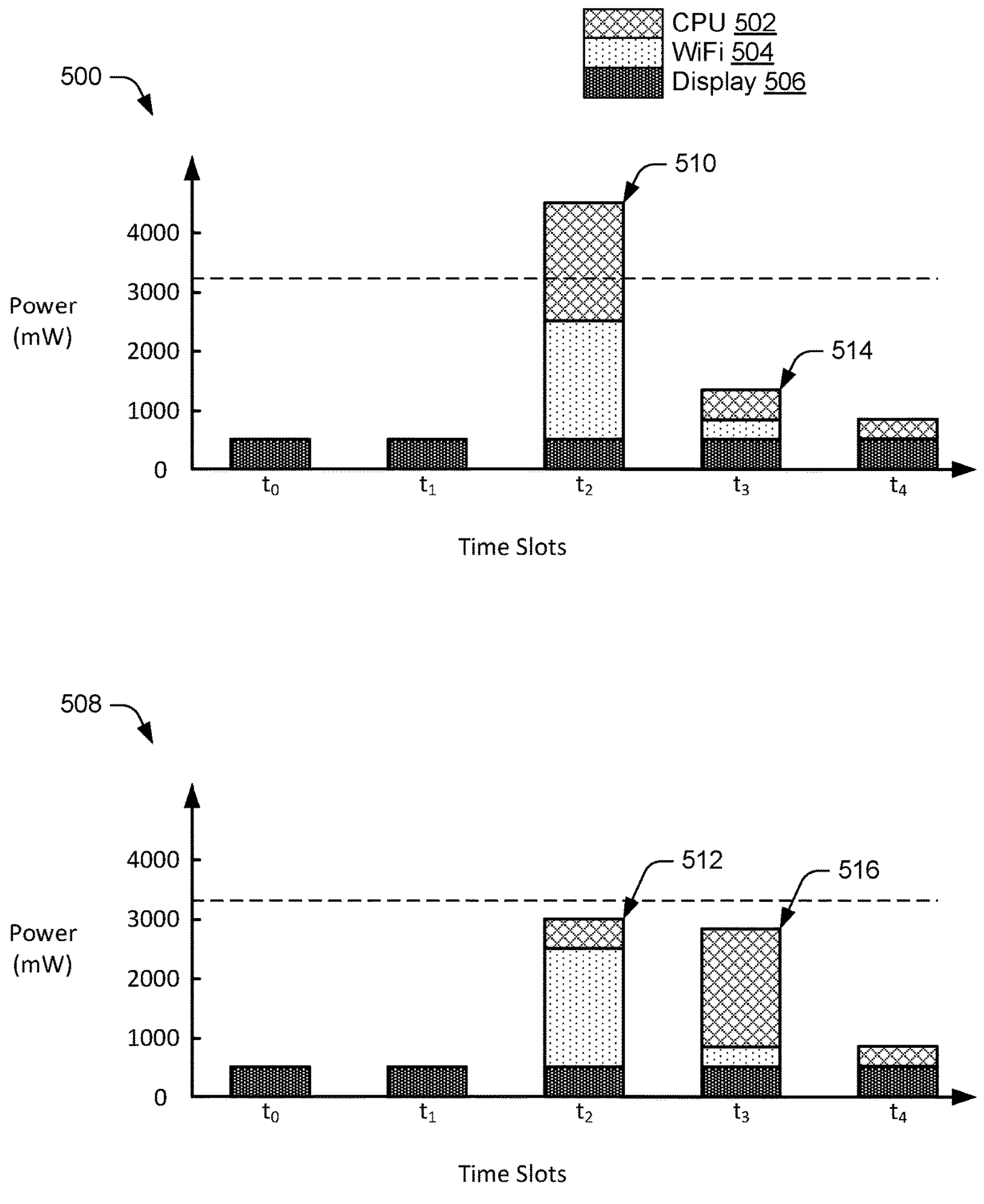
FIG. 5 illustrates an example alteration of component power states in accordance with one or more embodiments.

From the perspective of power manager 118, this spike in power consumption may be quantified as shown in power graph 500 of FIG. 5. In this particular example, power graph 500 includes respective power consumption levels for CPU 502, WiFi interface (WiFi 504), and display 506, each of which may correspond to the components described with respect to operating environment 100. In the context of operation 304, component profiler 204 and/or scheduler 210 determine respective amounts of power that each component will consume at a given time.

At 306, it is determined that the requisite amount of power exceeds the available amount of power. In some cases, such a determination may indicate that a battery will encounter its soft or hard shutdown threshold if the respective amounts of power are not altered. The determination may be made for a current point in time or a future point in time, such as an upcoming time slot in a schedule for task execution or performance. In some cases, this determination is not exact and can be made with a certain confidence level (e.g., >50% or >75%) or probability of occurrence. For example, when an expected amount of requisite power is close, but not in excess of the available amount of power, a probability that the actual amount of requisite power of power will spike beyond the available power can be estimated. Alternately or additionally, these confidence levels or probabilities can be adjusted over time by comparing estimates of requisite power and actual amounts of requisite power consumed during power spikes.

Continuing the ongoing example, scheduler 210 determines that the combined power consumption of CPU 502, WiFi 504, and display 506 at time $t_2$ will exceed the amount of power that battery cell 122 can provide while maintaining an operation voltage level.

At 308, one or more of the components' power states are altered effectively to reduce the amount of requisite power consumed to perform the task. Generally, the power states of the components are reduced to reduce a respective amount of power consumed by each component. In some cases, however, when a reduction of one component's power state significantly reduces power consumption, another component's power state may be increased if a net amount of power is still available for consumption. This may also be effective to mitigate some negative effects on user experience associated with reducing power states of various components.

In some embodiments, the components whose power states are altered may be selected based on interdependencies between the components. For example, a processor core may need to maintain a particular power state when supporting operations of other components, which may prevent a power state of the processor core from being further reduced. Alternately or additionally, a degree to which each component's power state is altered may depend on a minimum power state at which the component can support performance of the task.

In the context of the present example, scheduler 210 queries UX manager 206 and dependency manager 208 to determine which components' power states can be altered with minimal effect on user experience, yet still enable email syncing. Based on information provided by UX manager 206 and dependency manager 208, schedule 210 determines that a power state of CPU 502 can be altered at time $t_2$ with minimal impact to user experience.

Figure 6:
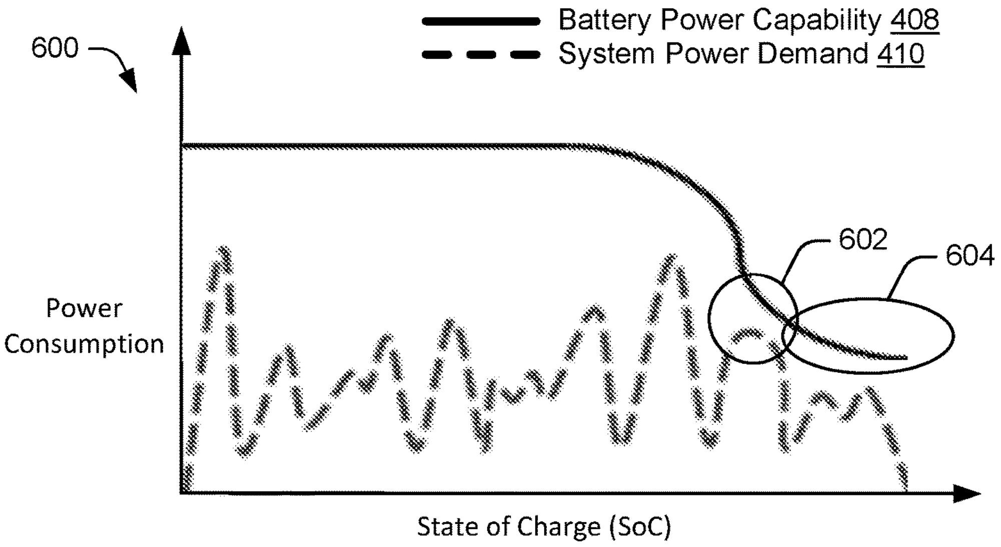
FIG. 6 illustrates an example of a suppressed power spike in the context of device power consumption.

As shown in power graphs 500 and 508, a power state of CPU 502 is reduced from $S_5$ at 510 to $S_2$ at 512, which is effective to keep power consumed at time $t_2$ below the 3.2 Watts that battery cell 122 can provide. By so doing, the spike in power consumption is suppressed, and smart phone 104 is able to continue to operate as shown in power graph 600 of FIG. 6. Here, note that by suppressing the power spike at 602, additional state-of-charge of battery cell 122 is accessible at 604. Here, note that this not only results in a longer run-time for smart phone 104, but allows for more efficient use of battery cell 122's energy.

Optionally at 310, one or more of the components' power states are restored or altered again. In some cases, the power states are restored or altered at another point in time or time slot in which the requisite power does not exceed the available power. This point in time may occur before or after the time at which a power spike is suppressed (e.g., time $t_1$). By restoring or increasing the power states of the components, the scheduler improves a rate or quality at which the task is performed.

Concluding the present example, scheduler 210 determines that a surplus amount of available power exists at time $t_3$. Here, scheduler 210 increases CPU 502's power state from $S_2$ at 514 to $S_5$ at 516, which is effective to mitigate any perceived performance degradation that may have been caused by reducing the power state of CPU 502 at time $t_2$.

Figure 7:
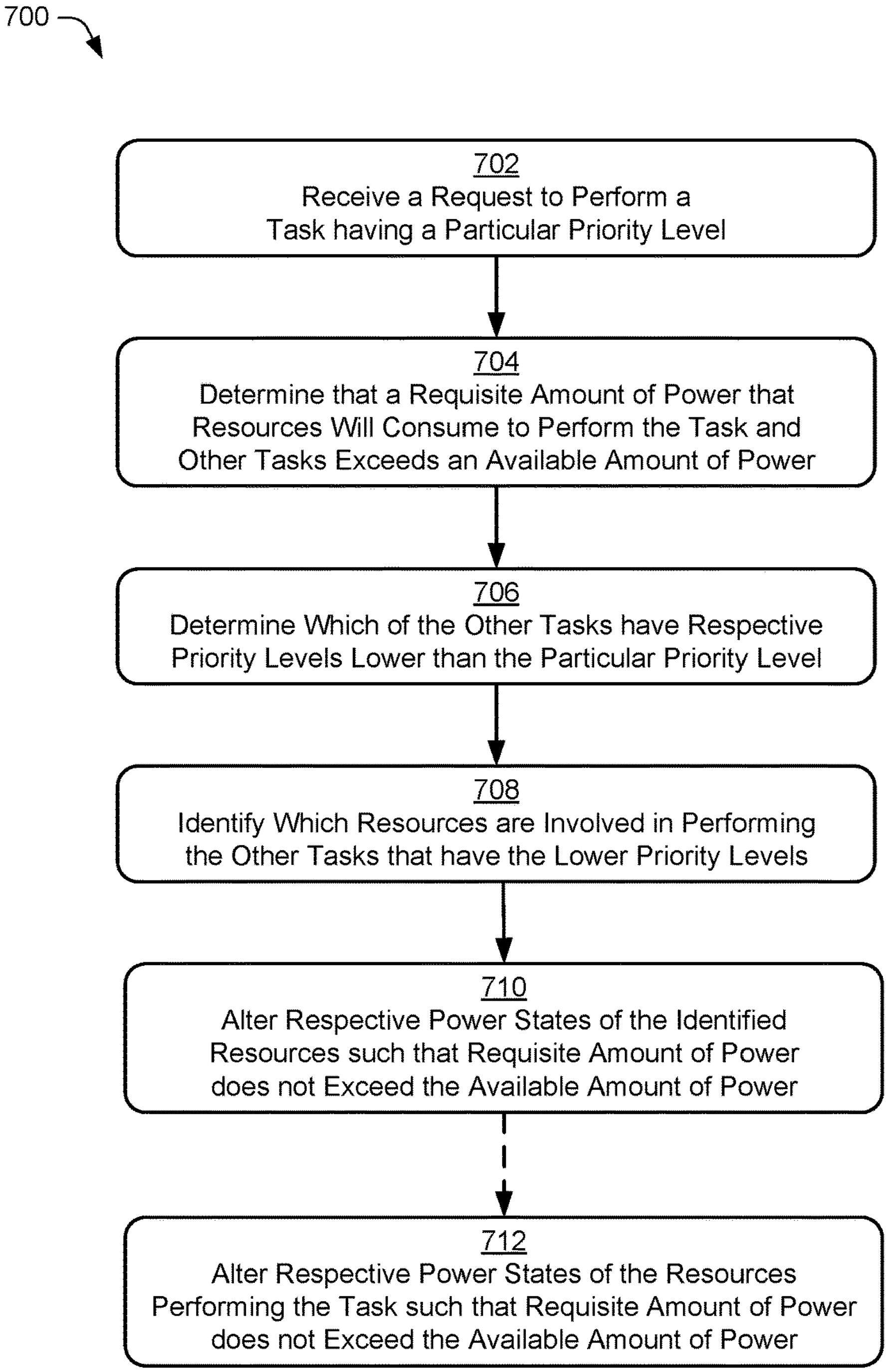
FIG. 7 illustrates an example method of altering power states of resources in accordance with one or more embodiments.

FIG. 7 depicts method 700 for altering power states of resources, including operations performed by power manager 118, dependency manager 208, or scheduler 210.

At 702, a request for a device to perform a task is received. The task may have an associated priority level indicating a priority for execution with respect to other tasks. In some cases, the request is received at an OS scheduler of the device through which tasks are prioritized for resource allocation. The task may be part of, or belong to, a thread, application, or operating system executing on a computing device.

At 704, it is determined that a requisite amount of power that resources of the device will consume to perform the task and other tasks will exceed an available amount of power. The other tasks utilizing the resources may include tasks of other applications or an operating system, such as background or housekeeping tasks.

In some embodiments, a terminal voltage of a battery is compared with a minimum operational level for the battery, which may indicate likelihood of device shutdown or brownout. The available amount of power may be an amount of power that a battery can provide without reaching a critical voltage threshold, such as shutoff voltage level. In some cases, the requisite amount of power is determined by component profiler 204. For example, the OS can estimate what effect execution of the task or operation will have by calculating an expected drop in battery voltage, which is an amount of current required to perform the task multiplied by the internal resistance of the battery, models of which are described herein.

At 706, it is determined which of the other tasks have respective priority levels that are lower than the priority level of the requested task. The requested task, which may be associated with a primary application of primary user interaction, may have a higher priority level than other tasks running in the background. For example, tasks associated with performing a video call or multimedia playback often have higher priority levels than these background tasks, such as memory management and storage functions. In some cases, a user interface or control, such as sliders associated with respective applications or tasks, enables a user to set levels of application performance with respect to priority or power saving actions applied to the applications or tasks. For example, a user may select to compromise performance of application to a certain degree thereby enabling more-aggressive power saving actions, such as reducing frame rates of a video call to extend device run-time.

At 708, the resources of the device involved with performing the other tasks having the lower priority levels are identified. In some cases, dependencies between resources of the task and resources of the other tasks are determined. For example, the task and the other tasks may both utilize respective amounts of a particular resource, such as a processor, memory, communication interface, and the like. In such cases, resources involved solely with performing the other tasks may be identified, rather than those resources that are shared with the task having the higher priority.

At 710, respective power states of the identified resources are altered to reduce the requisite amount of power consumed by the resources. In some cases, the respective power states of the identified resources are reduced to decrease the amount of requisite power consumed by the resources. Alternately or additionally, relative timing of tasks or operations of the device may be altered or staggered such that the current-consuming operations do not occur simultaneously. This may be effective to reduce power states of the identified resources or the other resources that correspond with the current-consuming operations.

These techniques, either alone or in combination, can be effective to reduce the requisite amount of power such that the requisite amount of power does not exceed the available amount of power. In some cases, this can be effective to enable the task having the higher priority to be performed via resources at default or higher power states. By so doing, service or quality of the task (e.g., user experience) may be preserved or improved in contrast to an atomic degradation of resource performance (e.g., throttling all resources of a device).

In yet other cases, such as when a brown out or device reset is not likely to occur, altering power states of components or re-scheduling execution of tasks to smooth out the load on the battery can be effective increase usable battery capacity. On average, reducing the amount of current load on the battery reduces an amount of energy lost to internal resistance of the battery. As noted herein, as the battery capacity is depleted during device operation (e.g., close to a minimum voltage threshold), this load smoothing capability becomes even more important because the point of system brownout or blackout can be delayed.

Optionally at 712, respective power states of the resources involved with performing the requested task are altered to further reduce the amount of requisite power consumed by the resources. In some cases, altering the power states associated with performing the other tasks may not reduce the requisite power by a sufficient amount. In such cases, altering the respective power states of the resources involved with performing the task having the higher priority level may further reduce the requisite power consumed. This can be effective to reduce the requisite amount of power such that the requisite amount of power does not exceed the available amount of power when the task is performed. Although the service or quality of the task may also be reduced, by preventing the requisite amount of power from exceeding the available amount of power, the device can continue to operate and provide user functionality.

Figure 8:
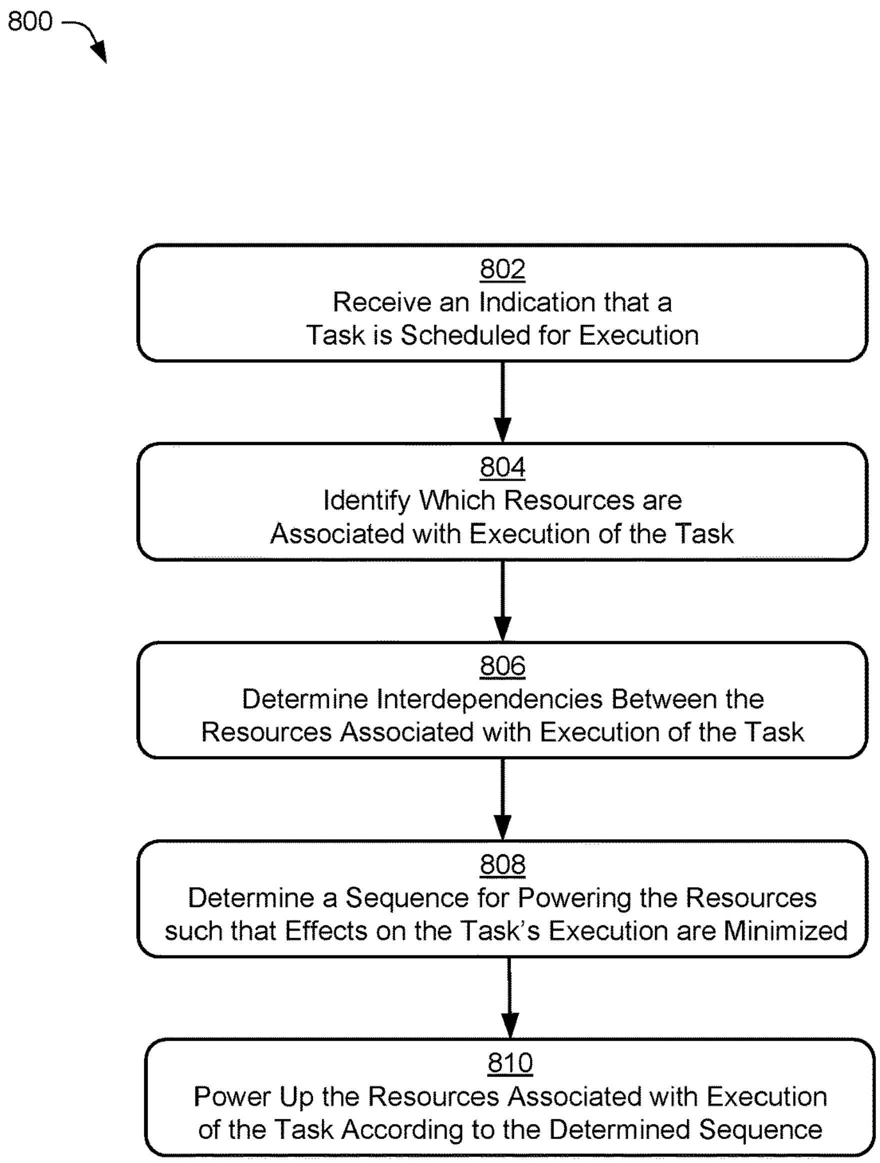
FIG. 8 illustrates an example method for sequencing resource powering in accordance with one or more embodiments.

FIG. 8 depicts method 800 for sequencing resource powering, including operations performed by power manager 118 or scheduler 210.

At 802, an indication is received that a task is scheduled for execution. The task may be part of a thread, application, or operating system that is executing on a device. In some cases, the task is part of an operation that the device is configured to perform.

At 804, resources of a device that are associated with execution of the task are identified. These resources may include processing components, memory components, communication components, storage components, display components, and the like. Alternately or additionally, respective minimum power states for each component to enable execution of the task may also be determined.

At 806, interdependencies between the resources associated with the execution of the task are identified. The interdependencies may indicate respective operational or power states that a resource needs to maintain in order to enable other resources to execute at least a portion of the task. For example, a processor may need to maintain a non-idle power state to enable data communication via a wireless interface.

At 808, a sequence for powering the resources is determined. The sequence for powering the resources may minimize amounts of instantaneous power drawn by the resources during execution of the task. For example, rather than power all of the resources simultaneously, the resources are powered individually at different times. Alternately or additionally, the sequence may be configured to minimize any detrimental effects (e.g., user experience impairments) caused by sequencing or staggering the powering of the resources.

At 810, the resources associated with execution of the task are powered according to the determined sequence. Because powering up resources typically consumes higher amounts of power, staggering or sequencing the powering of the resources can be effective to reduce the amounts of instantaneous power drawn by the resources.

Figure 9:
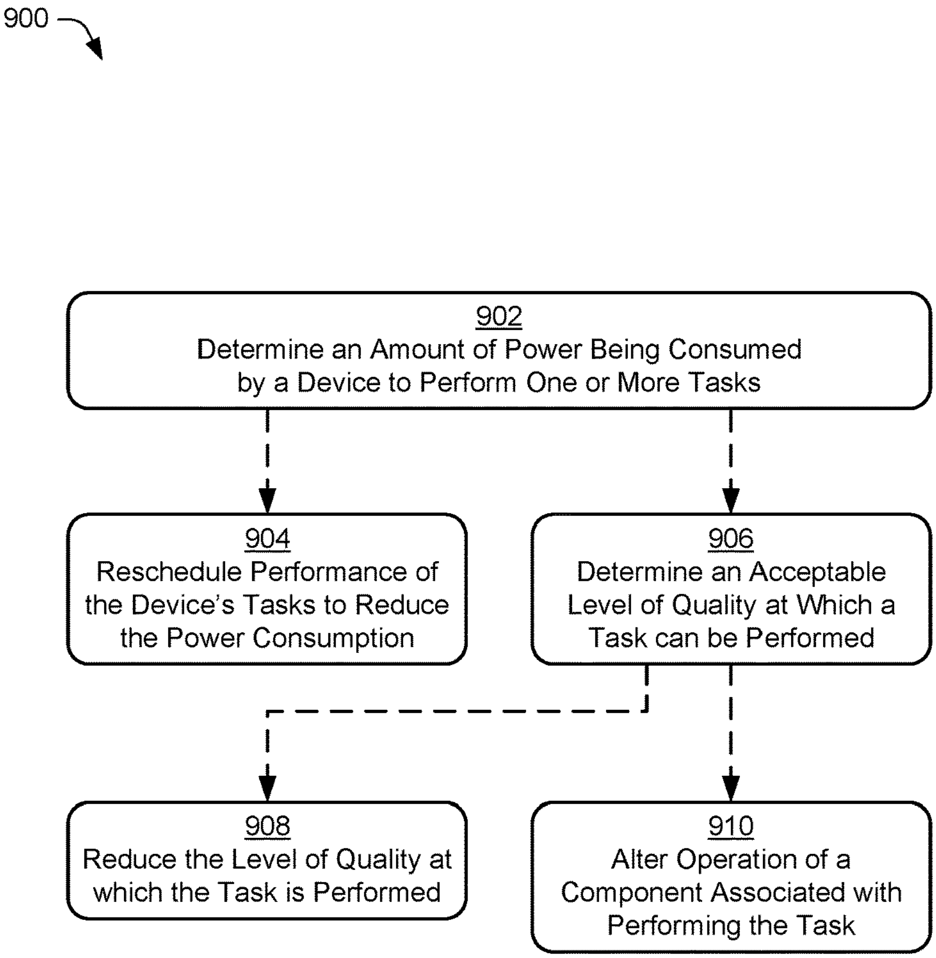
FIG. 9 illustrates an example method for reducing power consumption by managing applications or components of a device.

FIG. 9 depicts method 900 for reducing power consumption by managing applications or components of a device, including operations performed by power manager 118 or scheduler 210.

At 902, an amount of power being consumed by a device to perform one or more tasks is determined. The tasks may be part of a thread, application, or operating system that is executing on a device. In some cases, the task is part of an operation that the device is configured to perform. For example, an application of the device, such as a video calling application or video game, may correspond to multiple tasks scheduled for performance (e.g., execution) by the device. These tasks may include video processing, audio processing, graphics rendering, media encoding, and the like. In some embodiments, the tasks are associated with high power applications that can tolerate some level of error, degradation, or reduced quality (e.g., reduced sampling rates or frame rates). Alternately or additionally, these applications may generally involve signal processing, audio or video output, and/or user perception thereof.

Optionally at 904, performance of one or more of the tasks is scheduled to reduce the amount of power consumed by the device. In some cases, execution of at least some of the tasks is staggered or delayed effective to reduce an amount of current or power consumed simultaneously by components to perform the task. By way of example, consider a phone performing a video call that includes tasks for encoding video of a user, decoding video received from a sender, communicating bi-directional video and audio data. Instead of performing these tasks concurrently in single execution time slot, the tasks can be staggered across different time slots to reduce instantaneous power draw on the battery. By so doing, an amount of energy wasted within the device or battery thereof can be reduced. For example, reducing current draw can reduce losses associated with DC-DC conversion inefficiencies or increased levels of a battery's internal resistance at low SoCs.

Optionally at 906, an acceptable level of quality at which a task can be performed is determined. The acceptable level of quality may be a level at which a user is unable to notice a reduction in quality or a level that does not significantly impact a user experience associated with the task, or the application associated therewith. In some cases, input may be received from the user that indicates acceptable levels of quality or performance for a given application. Returning to the example of the video call, incoming or outgoing frame rates may be reduced approximately 5-15% without perceivably impacting a quality of the video call. By reducing these frame rates, processing components of the phone draw less current over a given duration of time, which in turn reduces an amount of waste energy consumed by the internal resistance of the phone's battery.

Optionally at 908, a level of quality at which the task is performed is reduced. This may also be effective to reduce a level of quality at which an application associated with the task is performed. As noted above, however, the user may not be able to perceive the reduced level in quality or may accept the reduced level in performance as a trade-off of extended device run-time. In the context of the video phone call, as the power capacity of a battery is reduced, the quality of the video call (e.g., frame rate) can be reduced effective to lengthen a duration of the video call, or any other application scenario, until performance becomes unbearable to the user. In some embodiments, the goal of reducing the level of quality for task performance is to keep power consumption below the power capacity of the battery. By so doing, device run time can be extended with minimal impact to the user's experience with applications of the device.

Optionally at 910, operation of a component associated with performing the task is reduced effective to reduce the amount of power consumed. In some cases, this may include reducing a frequency or voltage at which the component operates to process or communicate data. In other cases, a duty cycle of the component may be altered to increase an 'off' time. For example, consider phone or laptop presenting media via a light-emitting diode (LED) or organic-LED (OLED) backlit display. Here, assume that a user's eye can function as a virtual capacitor, which can by effective smooth out small bursts or intermittent changes in light.

Switching off or reducing brightness of the display for periods of approximately 10-20 milliseconds can reduce power consumed by the display. Further, at the granularity of approximately 10-20 milliseconds, this can be effective to mitigate the additional current draw associated with other components. In some cases, this additional current draw may include bursts of radio or CPU activity of approximately 10-20 milliseconds, during which the backlight of the display may be switched off to reduce overall power consumption. As noted above, the user may not be able to perceive the altered operation of the display, yet the overall power consumed by the device can be reduced. Alternately or additionally, a brightness of the display may be compensated by increasing brightness of the display in periods following those of reduced brightness.

Aspects of these methods may be implemented in hardware (e.g., fixed logic circuitry), firmware, a System-on-Chip (SoC), software, manual processing, or any combination thereof. A software implementation represents program code that performs specified tasks when executed by a computer processor, such as software, applications, routines, programs, objects, components, data structures, procedures, modules, functions, and the like. The program code can be stored in one or more computer-readable memory devices, both local and/or remote to a computer processor. The methods may also be practiced in a distributed computing environment by multiple computing devices.

Example Device

Figure 10:
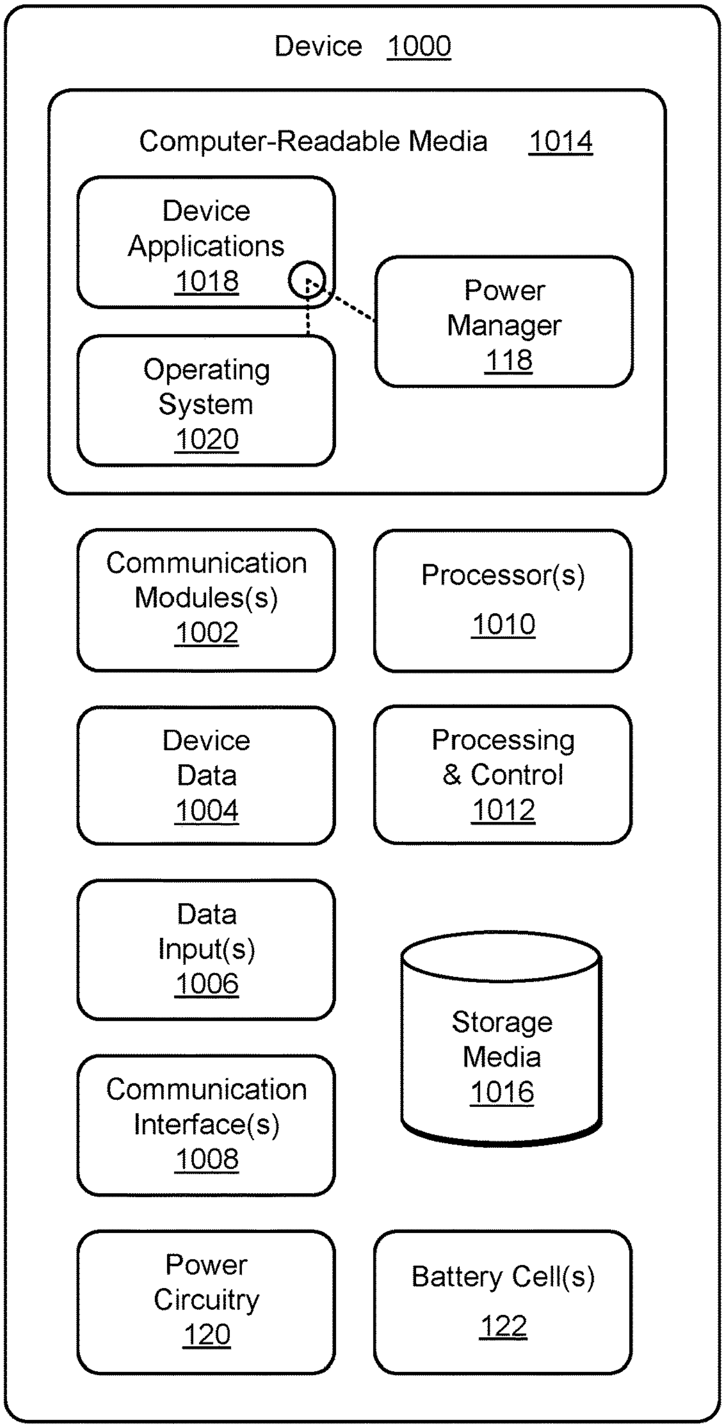
FIG. 10 illustrates an example device in which techniques of suppressing power spikes can be implemented.

FIG. 10 illustrates various components of example device 1000 that can be implemented as any type of mobile, electronic, and/or computing device as described with reference to the previous FIGS. 1-9 to implement techniques of suppressing power spikes. In embodiments, device 1000 can be implemented as one or a combination of a wired and/or wireless device, as a form of television client device (e.g., television set-top box, digital video recorder (DVR), etc.), consumer device, computer device, server device, portable computer device, user device, communication device, video processing and/or rendering device, appliance device, gaming device, electronic device, and/or as another type of device. Device 1000 may also be associated with a user (e.g., a person) and/or an entity that operates the device such that a device describes logical devices that include users, software, firmware, and/or a combination of devices.

Device 1000 includes communication modules 1002 that enable wired and/or wireless communication of device data 1004 (e.g., received data, data that is being received, data scheduled for broadcast, data packets of the data, etc.). Device data 1004 or other device content can include configuration settings of the device, media content stored on the device, and/or information associated with a user of the device. Media content stored on device 1000 can include any type of audio, video, and/or image data. Device 1000 includes one or more data inputs 1006 via which any type of data, media content, and/or inputs can be received, such as user-selectable inputs, messages, music, television media content, recorded video content, and any other type of audio, video, and/or image data received from any content and/or data source.

Device 1000 also includes communication interfaces 1008, which can be implemented as any one or more of a serial and/or parallel interface, a wireless interface, any type of network interface, a modem, and as any other type of communication interface. Communication interfaces 1008 provide a connection and/or communication links between device 1000 and a communication network by which other electronic, computing, and communication devices communicate data with device 1000.

Device 1000 includes one or more processors 1010 (e.g., any of microprocessors, controllers, and the like), which process various computer-executable instructions to control the operation of device 1000 and to enable techniques enabling suppression of power spikes. Alternatively or in addition, device 1000 can be implemented with any one or combination of hardware, firmware, or fixed logic circuitry that is implemented in connection with processing and control circuits which are generally identified at 1012. Although not shown, device 1000 can include a system bus or data transfer system that couples the various components within the device. A system bus can include any one or combination of different bus structures, such as a memory bus or memory controller, a peripheral bus, a universal serial bus, and/or a processor or local bus that utilizes any of a variety of bus architectures. Device 1000 also includes power circuitry 120 and battery cells 122, which are configured to provide device 1000 with operating power. Device 1000 may also include interfaces to receive external power, such as from an AC source or externally connected batteries configured similar to battery cells 122.

Device 1000 also includes computer-readable storage media 1014, such as one or more memory devices that enable persistent and/or non-transitory data storage (i.e., in contrast to mere signal transmission), examples of which include random access memory (RAM), non-volatile memory (e.g., any one or more of a read-only memory (ROM), flash memory, EPROM, EEPROM, etc.), and a disk storage device. A disk storage device may be implemented as any type of magnetic or optical storage device, such as a hard disk drive, a recordable and/or rewriteable compact disc (CD), any type of a digital versatile disc (DVD), and the like. Device 1000 can also include a mass storage media device 1016.

Computer-readable storage media 1014 provides data storage mechanisms to store device data 1004, as well as various device applications 1018 and any other types of information and/or data related to operational aspects of device 1000. For example, an operating system 1020 can be maintained as a computer application with the computer-readable storage media 1014 and executed on processors 1010. Device applications 1018 may include a device manager, such as any form of a control application, software application, signal-processing and control module, code that is native to a particular device, a hardware abstraction layer for a particular device, and so on.

Device applications 1018 also include any system components or modules to implement the techniques, such as power manager 118 and any combination of components thereof.

Conclusion

Although embodiments of techniques and apparatuses of suppressing power spikes have been described in language specific to features and/or methods, it is to be understood that the subject of the appended claims is not necessarily limited to the specific features or methods described. Rather, the specific features and methods are disclosed as example implementations of suppressing power spikes.

What is claimed is:

1. A computer-implemented method comprising:

determining, for an upcoming point in time, an available amount of power that a battery of a computing device is capable of providing while maintaining a predefined voltage level, wherein the predefined voltage level is at or above a cutoff voltage level at which the computing device ceases to operate;

determining, for the upcoming point in time, a requisite amount of power that components of the computing device will consume to perform multiple tasks at their respective power states, wherein maintaining the predefined voltage level is effective to enable the computing device to continue to operate while the components consume the requisite amount of power; and rescheduling, responsive to determining that the requisite amount of power exceeds the available amount of power, at least one of the multiple tasks to reduce the amount of requisite power that the components consume at the upcoming point in time effective to enable the battery to maintain the predefined voltage level.

2. The computer-implemented method as described in claim 1, wherein the available amount of power is determined based on an open circuit potential, internal resistance, or load current of the battery.

3. The computer-implemented method as described in claim 1, wherein the upcoming point of time is part of a time slot and the multiple tasks are scheduled for execution during the time slot.

4. The computer-implemented method as described in claim 3, wherein rescheduling the at least one task comprises rescheduling the at least one task for execution during another time slot.

5. The computer-implemented method as described in claim 4, wherein the time slot and other time slots are time slots of an operating system (OS) scheduling component of the computing device.

6. The computer-implemented method as described in claim 1, wherein the requisite amount of power that the components will consume is determined based on respective power states of the components.

7. The computer-implemented method as described in claim 1, wherein at least one of the multiple tasks is part of a thread, application, or operating system that is executing on the computing device.

8. A computer-implemented method comprising:

receiving an indication that a task is scheduled for execution at an upcoming point in time;

determining that a requisite amount of power that resources of a device will consume, while maintaining a predefined voltage level, to perform the task and other tasks scheduled for execution at the upcoming point in time exceeds an available amount of power that a battery of the device can provide, wherein the predefined voltage level is at or above a cutoff voltage level at which the computing device ceases to operate and the predefined voltage level is effective to enable the computing device to continue to operate while the components consume the requisite amount of power;

determining, responsive to determining that the requisite amount of power exceeds the available amount of power, which ones of the other tasks have respective priority levels that are lower than a priority level of the task; and rescheduling at least one of the other tasks with a lower priority level to reduce the amount of requisite power that the components consume at the upcoming point in time such that the requisite power does not exceed the available amount of power when the task is performed.

9. The computer-implemented method as described in claim 8, wherein the available amount of power is determined based on an open circuit potential, internal resistance, or load current of the battery.

10. The computer-implemented method as described in claim 8, wherein the upcoming point of time for which the task is scheduled for execution is part of a time slot and the other tasks are scheduled for execution during the time slot.

11. The computer-implemented method as described in claim 10, wherein rescheduling the at least one other task comprises rescheduling the at least one other task for execution during another time slot.

12. The computer-implemented method as described in claim 8, wherein the at least one other task having the lower respective priority level is background task of an operating system or application.

13. The computer-implemented method as described in claim 8, further comprising:

identifying which of the resources are associated with execution of the task;

determining interdependencies between the resources associated with execution of the task; and determining, based on the interdependencies of the resources, a sequence for utilizing the resources such that an amount of power consumed to execute the task is minimized.

14. The computer-implemented method as described in claim 8, further comprising:

determining, prior to determining the requisite amount of power, an acceptable level of quality at with the task can be performed; and reducing the level of quality at which the task is performed effective to reduce the requisite amount of power that the resources of the device will consume to perform the task.

15. A system comprising:

a battery from which the system draws power to operate;

hardware-based resources by which the system performs tasks;

a power manager configured to perform operations comprising:

determining, for an upcoming point in time, an available amount of power that the battery of the system is capable of providing while maintaining a particular voltage level, wherein the particular voltage level is at or above a cutoff voltage level at which the computing device ceases to operate;

determining, for the upcoming point in time, a requisite amount of power that the hardware-based resources will consume to perform the tasks at their respective power states, wherein maintaining the particular voltage level is effective to enable the computing device to continue to overate while the components consume the requisite amount of power; and rescheduling, responsive to determining that the requisite amount of power exceeds the available amount of power, at least one of the tasks to reduce the amount of requisite power that the hardware-based resources consume at the upcoming point in time effective to enable the battery to maintain the particular voltage level.

16. The system as described in claim 15, wherein the available amount of power that the battery is capable of providing is determined based on an open circuit potential, internal resistance, and load current of the battery.

17. The system as described in claim 15, wherein:

the upcoming point of time is part of a time slot and the multiple tasks are scheduled for execution during the time slot; and rescheduling the at least one task comprises rescheduling the at least one task for execution during another time slot.

18. The system as described in claim 15, wherein the hardware-based resources of the system comprise at least one of a processing resource, memory resource, display resource, graphics processing resource, communication resource, or mass storage resource.

* * * * *